United States Patent
Jang et al.

(10) Patent No.: US 7,960,844 B2
(45) Date of Patent: Jun. 14, 2011

(54) 3-DIMENSIONAL FLASH MEMORY DEVICE, METHOD OF FABRICATION AND METHOD OF OPERATION

(75) Inventors: Young-Chul Jang, Seoul (KR); Han-Soo Kim, Suwon-si (KR); Jae-Hun Jeong, Hwaseong-si (KR); Soon-Moon Jung, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 221 days.

(21) Appl. No.: 12/499,980

(22) Filed: Jul. 9, 2009

(65) Prior Publication Data
US 2010/0012997 A1     Jan. 21, 2010

(30) Foreign Application Priority Data
Jul. 17, 2008   (KR) .................. 10-2008-0069606

(51) Int. Cl.
*H01L 23/48* (2006.01)
(52) U.S. Cl. ............. 257/777; 438/109; 257/E21.614; 257/E25.006
(58) Field of Classification Search .......... 257/67, 257/686, 698, 777, E21.614, E25.006; 438/109
See application file for complete search history.

(56) References Cited

U.S. PATENT DOCUMENTS

| | | | |
|---|---|---|---|
| 6,541,324 B1 | 4/2003 | Wang | |
| 7,271,451 B2 | 9/2007 | Liaw | |
| 7,355,885 B2 * | 4/2008 | Fukuzumi | .............. 365/158 |
| 2007/0200182 A1 | 8/2007 | Liaw | |

FOREIGN PATENT DOCUMENTS

| | | |
|---|---|---|
| JP | 2006019735 A | 1/2006 |
| KR | 100230426 B1 | 8/1999 |
| KR | 100687051 B1 | 2/2007 |
| KR | 1020080035799 A | 4/2008 |
| KR | 100829611 B1 | 5/2008 |

* cited by examiner

*Primary Examiner* — Quoc D Hoang
(74) *Attorney, Agent, or Firm* — Volentine & Whitt, PLLC

(57) ABSTRACT

Disclosed are a flash memory device and method of operation. The flash memory device includes a bottom memory cell array and a top memory cell array disposed over the bottom memory cell array. The bottom memory cell array includes a bottom semiconductor layer, a bottom well, and a plurality of bottom memory cell units. The top memory cell array includes a top semiconductor layer, a top well, and a plurality of top memory cell units. A well bias line is disposed over the top memory cell array and includes a bottom well bias line and a top well bias line, The bottom well bias line is electrically connected to the bottom well, and the top well bias line is electrically connected to the top well.

20 Claims, 25 Drawing Sheets

US 7,960,844 B2

3-DIMENSIONAL FLASH MEMORY DEVICE, METHOD OF FABRICATION AND METHOD OF OPERATION

CROSS-REFERENCE TO RELATED APPLICATION

This U.S. non-provisional patent application claims priority under 35 U.S.C § 119 to Korean Patent Application No. 10-2008-0069606 filed on Jul. 17, 2008, the subject matter of which is hereby incorporated by reference.

BACKGROUND

The present invention relates to semiconductor devices and methods of fabrication and operation. More specifically, the invention relates to flash memory devices having a 3-dimensional arrangement of memory cell arrays and methods of fabricating same and operating same.

The demand for higher performance at lower cost continues to drive the integration density of contemporary semiconductor devices. In this regard, semiconductor devices having 3-dimensionally arranged (or vertically stacked) transistors have been proposed. In many 3-dimensional flash memory devices, a well region associated with a bottom (or lower) memory cell array and a well region associated with a top (or upper) memory cell array are connected to each other. As a result, the bottom and top memory cell arrays cannot be independently controlled during an erase or program operation.

SUMMARY

Embodiments of the invention provide flash memory devices, methods of fabricating same, and methods of operating same.

According to one embodiment, a flash memory device includes; a bottom memory cell array including a bottom semiconductor layer, a bottom well formed in the bottom semiconductor layer, and a plurality of bottom memory cell units disposed on the bottom well, a top memory cell array disposed over the bottom memory cell array and including a top semiconductor layer, a top well formed in the top semiconductor layer, and a plurality of top memory cell units disposed on the top well, and a well bias line disposed over the top memory cell array and including a bottom well bias line and a top well bias line, wherein the bottom well bias line is electrically connected to the bottom well, and the top well bias line is electrically connected to the top well.

In another embodiment, a method of operating this type of flash memory device is disclosed. The method includes applying a first voltage to the bottom well bias line to program or erase the bottom memory cell array, and applying a second voltage to the top well bias line to program or erase the top memory cell array. The application of the first and second voltages may in certain embodiments result in the independent program or erasure of the bottom memory cell array and the top memory cell array.

DESCRIPTION OF EMBODIMENTS

A transistor typically operates in relation to three (3) terminals; a gate, a source, and a drain. However, a semiconductor transistor may operate in relation to four (4) terminals; a gate, a source, a drain, and a body. The "body" of a transistor may be implemented, at least in part, by a well region (hereafter "well") formed in a semiconductor substrate.

As noted above, many contemporary semiconductor devices are being implemented as 3-dimensional devices in order to maximize integration density and conserve space in a constituent host device. Flash memory devices, for example, may include a bottom (lower) semiconductor layer upon which a top (upper) semiconductor layer is stacked. Of course, more than two semiconductor layers may be stacked in a 3-dimensional semiconductor device, but embodiments of the present invention may be understood by examples including only bottom and top layers. The bottom and top semiconductor layers may include respectively a top well and a bottom well. Embodiments of the invention provide fabrication methods, flash memory devices and methods of operation wherein the top and bottom wells may have a bias voltage independently applied in order to achieve independent operation of the respective memory cell arrays.

The present invention will now be described in some additional detail with reference to the accompanying drawings. The invention may, however, be embodied in many different forms and should not be construed as being limited to only the illustrated embodiments. Rather, the embodiments are presented as teaching examples. Throughout the written description and drawings, like reference numbers and labels are used to denote like or similar elements and features.

Throughout the drawings, the size and/or thickness (or relative thicknesses) of various layers and regions may be exaggerated for clarity. It will be understood that when a layer is said to as be "on" another layer or substrate, it may be "directly on" the other layer or substrate, or intervening layers may also be present.

Figure 1:
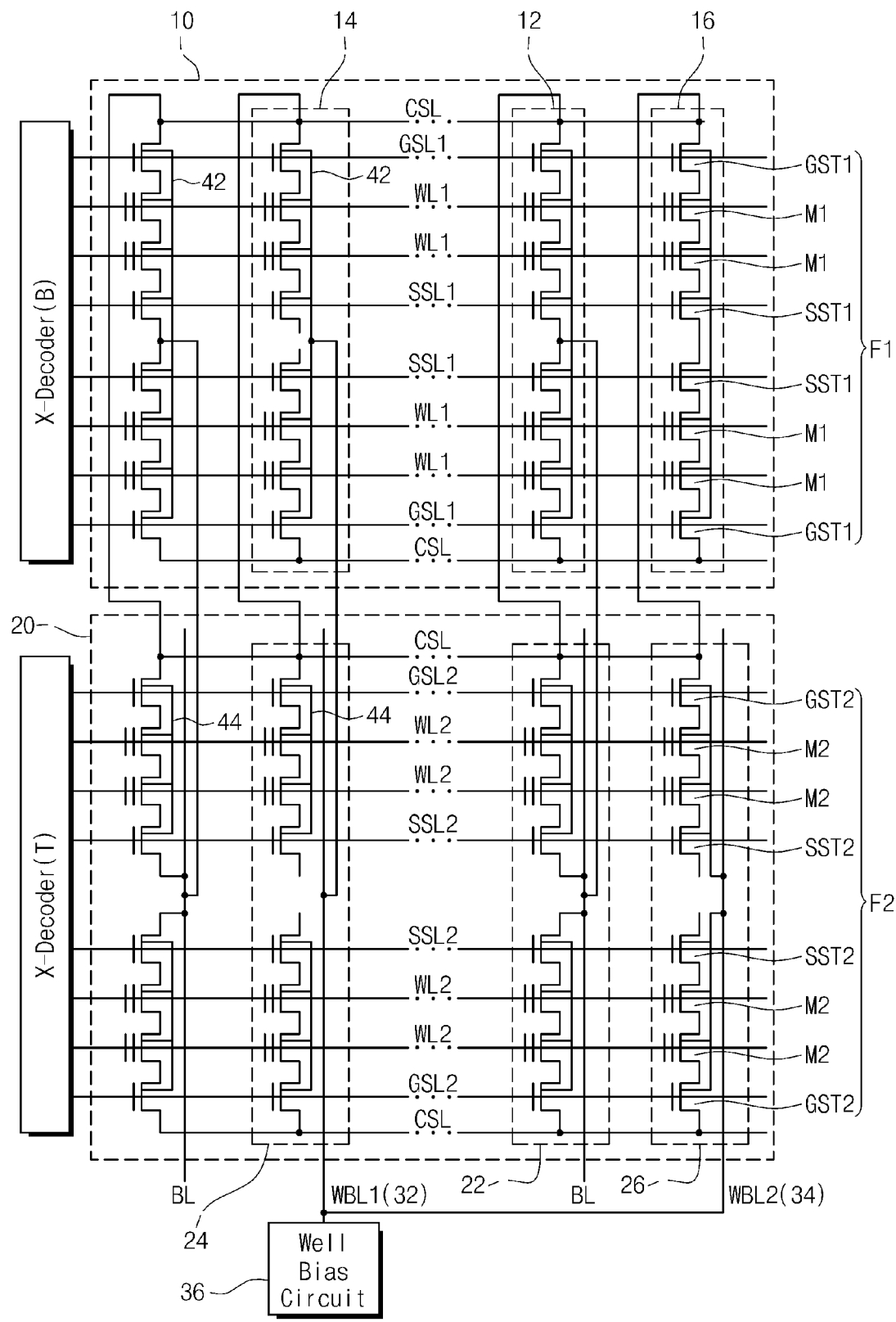
FIGS. 1 and 2 are circuit diagrams of flash memory devices according to embodiments of the invention.
Figure 2:
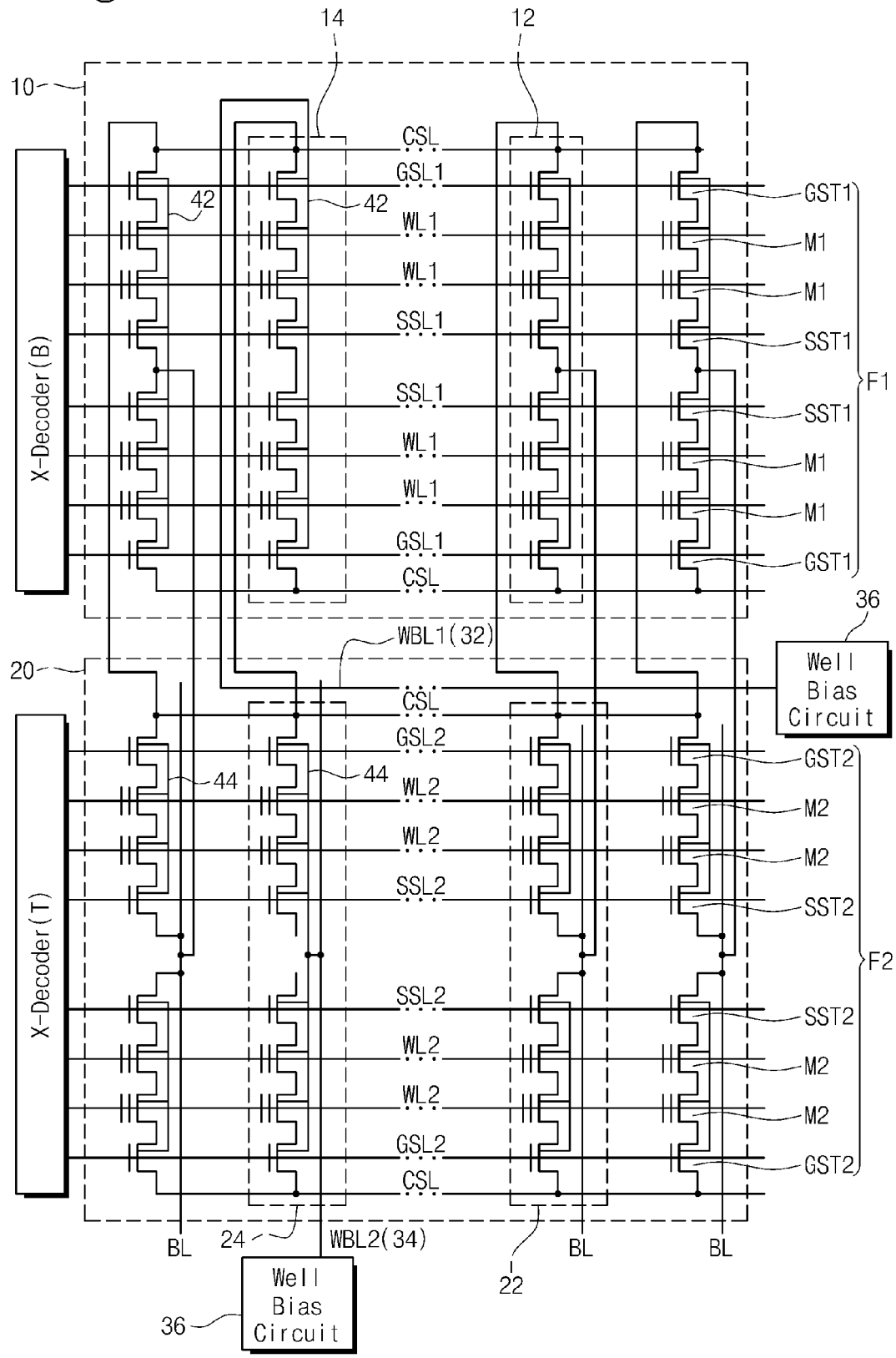

FIGS. 1 and 2 are circuit diagrams of flash memory devices according to embodiments of the invention.

Referring to FIG. 1, the exemplary flash memory device includes a bottom memory cell array 10 having a bottom semiconductor layer F1, a bottom well region 42 formed at the bottom semiconductor layer F1, and a plurality of cell units 12 disposed on the bottom well region 42. The flash memory device further includes a top memory cell array 20 including a top semiconductor layer F2, a top well region 44 formed at the top semiconductor layer F2, and a plurality of top memory cell units 22 disposed on the top well region 44. The top memory cell array 20 is disposed over the bottom memory cell array 10. The flash memory device further includes a well bias line disposed over the memory cell array 10 and including a bottom well bias line (WBL1) 32 and a top well bias line (WBL2) 34.

The bottom well bias line 32 is electrically connected to the bottom well region 42, and the top well bias line 34 is electrically connected to the top well region 44. A body bias of the top memory cell array 20 and the bottom memory cell array 10 may be generated by applying voltages to the bottom well region 42 and the top well region 44, respectively. An applied voltage of the bottom well bias line 32 may be used to program or erase the bottom memory cell array 10, and an applied voltage of the top well bias line 34 may be used to program or erase the top memory cell array 20. Thus, the top memory cell array 20 and the bottom memory cell array 10 are capable of independent program or erase operation. In the illustrated embodiments, the top well bias line 34 and the bottom well bias line 32 are electrically connected to a well bias circuit 36.

The bottom memory cell array 10 includes first and second bottom dummy memory cell units 14 and 16. The top memory cell array 20 includes first and second top dummy memory cell units 24 and 26. The bottom well bias line 32 is provided to a region where the first bottom dummy memory cell unit 14 is disposed and is electrically connected to the bottom well region 42 through the first bottom dummy memory cell unit 14. The first bottom dummy memory cell unit 14 and the first top dummy memory cell unit 24 may be vertically aligned within the semiconductor flash device. The second bottom dummy memory cell unit 16 and the second top dummy memory cell unit 26 may also be vertically aligned. Thus, in certain embodiments of the invention the first dummy memory cell unit 14 and the second top dummy memory cell unit 26 are disposed at an offset and are not vertically aligned with each other.

The first and second bottom dummy memory cell units 14 and 16 and the bottom memory cell units 12 include a bottom string selection transistor SST1, a bottom ground selection transistor GST1, and a plurality of bottom cell transistors M1 serially connected between the bottom string and ground selection transistors SST1 and GST1. The gates of the adjacent bottom string selection transistors SST1 are connected to each other to form a bottom string selection line SSL1. Similarly, the gates of the adjacent bottom ground selection transistors GST1 are connected to each other to form a bottom ground selection line GSL1. The adjacent cell transistors M1 are connected to each other to form bottom wordlines WL1.

The first and second top dummy memory cell units 24 and 26 and the top memory cell units 22 include a top string selection transistor SST2, a top ground selection transistor GST2, and a plurality of top cell transistors M2 serially connected between the top string and ground selection transistors SST2 and GST2. The gates of the adjacent top string selection transistors SST2 are connected to each other to form a top string selection line SSL2. Similarly, the gates of the adjacent bottom selection transistors GST2 are connected to each other to form a top ground selection line GSL2. The adjacent cell transistors M2 are connected to each other to form top wordlines WL2.

In the illustrated embodiments, the bottom well bias line 32 is connected to the bottom well region 42 through a bottom dummy drain region of the bottom string selection transistor SST1 of the first bottom dummy memory cell unit 14. The top well bias line 34 is connected to the top well region 44 through a top dummy drain region of the top string selection transistor SST2 of the second dummy memory cell unit 26.

The bottom wordlines WL1, the bottom ground selection line GSL1, and the bottom string selection line SSL1 are electrically connected to an X-decoder B. The top wordlines WL2, the top ground selection line GSL2, and the top string selection line SSL2 are electrically connected to an X-decoder T.

A bitline BL is disposed over the memory cell array 20. That is, the bitline BL is disposed corresponding to the bottom memory cell units 12 and the top memory cell units 22 which are vertically aligned. The bitline BL is electrically connected to a top drain region of the top selection transistor SST2 and a bottom drain region of the bottom selection transistor SST1. A bottom source region of the adjacent ground selection transistors GST1 is electrically connected to a common source line CSL. A top source region of the adjacent ground selection transistors GST2 is electrically connected to the common source line CSL. Thus, the common source line CSL is commonly used by the top memory cell array and bottom memory cell array.

Referring to FIG. 2, the flash memory device includes a bottom memory cell array 10 including a bottom semiconductor layer F1, a bottom well region 42 formed at the bottom semiconductor layer F1, and a plurality of bottom memory cell units 12 disposed on the bottom well region 42. The flash memory device also includes a top memory cell array 20 including a top semiconductor layer F2, a top well region 44 formed at the top semiconductor layer F2, and a plurality of top memory cell units 22 formed on the top well region 44. The top memory cell array 20 is disposed over the bottom memory cell array 10.

The flash memory device includes a well bias line disposed over the bottom memory cell array 20 and including a bottom well bias line (WBL1) 32 and a top well bias line (WBL2) 34. The bottom well bias line (WBL1) 32 is electrically connected to the bottom well region 42, and the top well bias line (WBL2) 34 is electrically connected to the top well region 44. A body bias of the top and bottom memory cell arrays 20 and 10 is generated by applying voltages to the bottom and top well regions 42 and 44, respectively. In order to program or erase the bottom memory cell array 10 a voltage is applied to the bottom well bias line 32. In order to program or erase the top memory cell array 20, a voltage is applied to the top well bias line 34. Thus, the top and bottom memory cell arrays 20 and 10 may be independently programmed or erased. In the illustrated embodiment, the top well bias line (WBL2) 34 and the bottom well bias line (WBL1) 32 are electrically connected to a well bias circuit 36.

The bottom memory cell array 10 includes a bottom memory cell unit 14, and the top memory cell array 20 includes a top dummy memory cell unit 24 vertically aligned to the bottom memory cell unit 14. The top well bias line (WBL2) 34 is provided in a region where the top dummy memory cell unit 24 is disposed and is electrically connected to the top well region 44 through the top dummy memory cell unit 24. The bottom well bias line (WBL1) 32 and the top well bias line (WBL2) 34 are disposed perpendicular to each other in different planes and may be electrically connected.

The bottom dummy memory cell unit 14 and the bottom memory cell units 12 include a bottom string selection transistor SST1, a bottom ground selection transistor GST1, and a plurality of cell transistors M1 serially connected between the top and bottom ground selection transistors SST1 and GST1. The gates of the adjacent top string selection transistors SST1 are connected to each other to form a bottom string selection line SSL1, and the gates of the adjacent ground selection transistors GST1 are connected to each other to form a top ground selection line GSL1. The adjacent cell transistors M1 are connected to each other to form top wordlines WL1.

The top dummy memory cell unit 24 and the top memory cell units 22 include a top string selection transistor SST2, a bottom ground selection transistor GST2, and a plurality of cell transistors M2 serially connected between the top and bottom ground selection transistors SST2 and GST2. The gates of the adjacent top string selection transistors SST2 are connected to each other to form a bottom string selection line SSL2, and the gates of the adjacent ground selection transistors GST2 are connected to each other to form a top ground selection line GSL2. The adjacent cell transistors M2 are connected to each other to form top wordlines WL2.

The top well bias line (WBL2) 34 is connected to the top well region 44 through a top dummy drain region of the top string selection transistor SST2 in the dummy memory cell unit 24. The bottom well bias line (WBL1) 32 is disposed adjacent to a bottom dummy source region of the bottom ground selection transistor GST1 in the bottom dummy memory cell unit 14 and is connected the bottom well region 42 through an isolation well region that is electrically isolated from the dummy source region.

The bottom wordlines WL1, the bottom ground selection line GSL1, and the bottom string selection line SSL1 are electrically connected to an X-decoder B. The top wordlines WL2, the top ground selection line GSL2, and top string selection line SSL2 are electrically connected to an X-decoder T.

A bitline BL is disposed on the top memory cell array 20. The bitline BL is disposed to correspond to the bottom and top memory cell units 12 and 22 which are vertically aligned. The bitline BL is electrically connected to drain regions of the top and bottom selection transistors SST2 and SST1. Source regions of the adjacent bottom and top ground selection transistors GST1 and GS2 are electrically connected to a common source line CSL. The bottom well bias line (WBL1) 32 are disposed in the same direction as the common source line CSL between the adjacent common source line CSL.

Figure 3A:
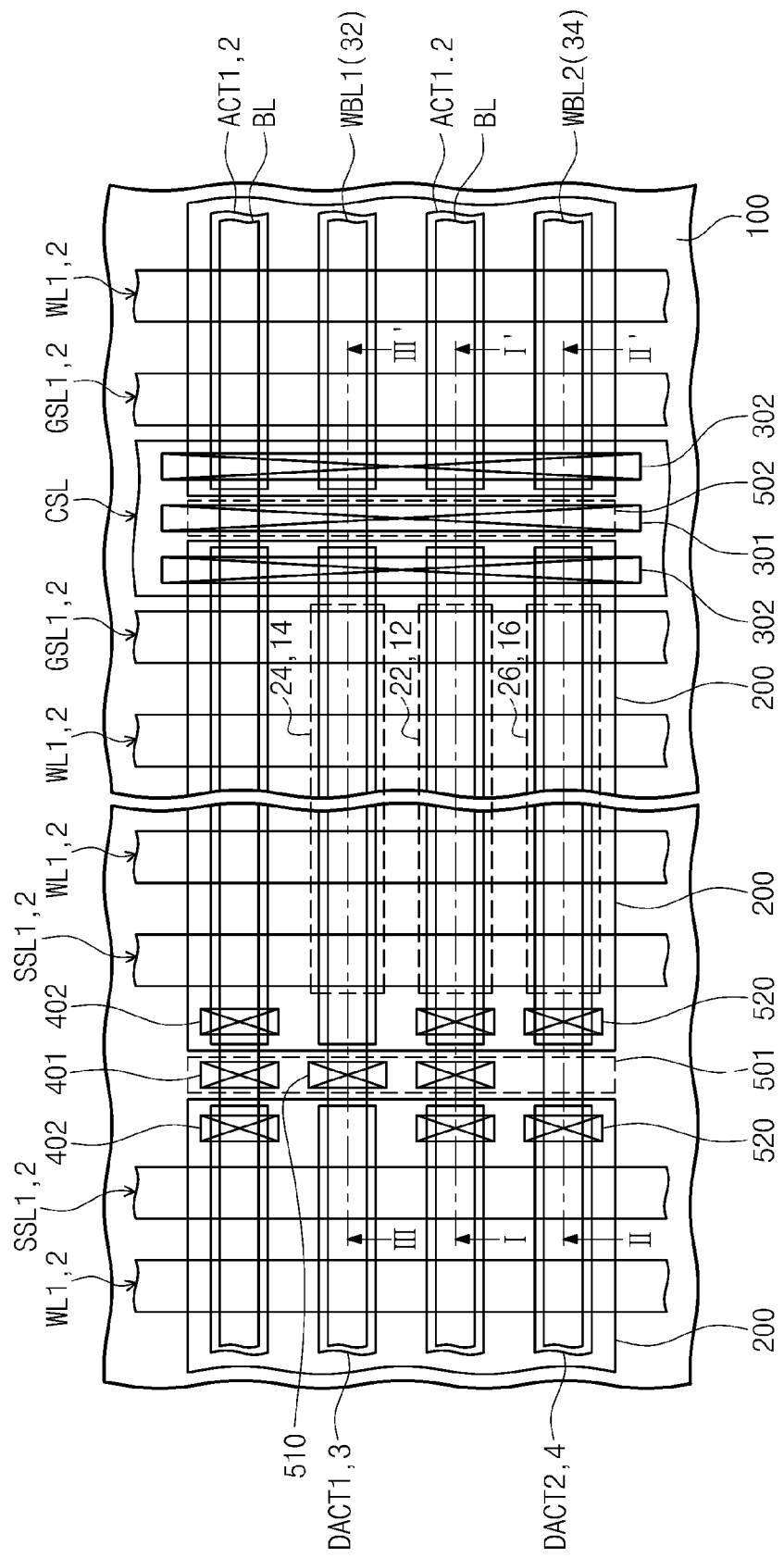
FIGS. 3A through 3D illustrate a flash memory device according to an embodiment of the invention.
Figure 3B:
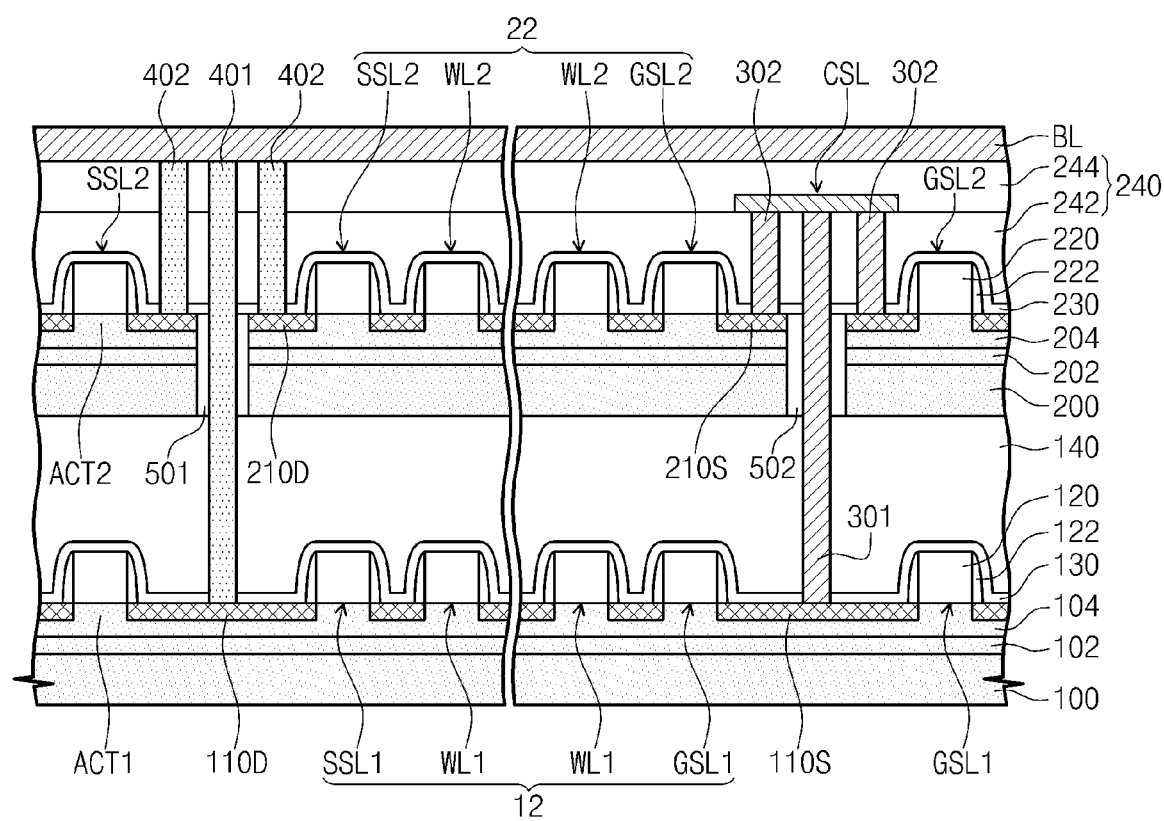
Figure 3C:
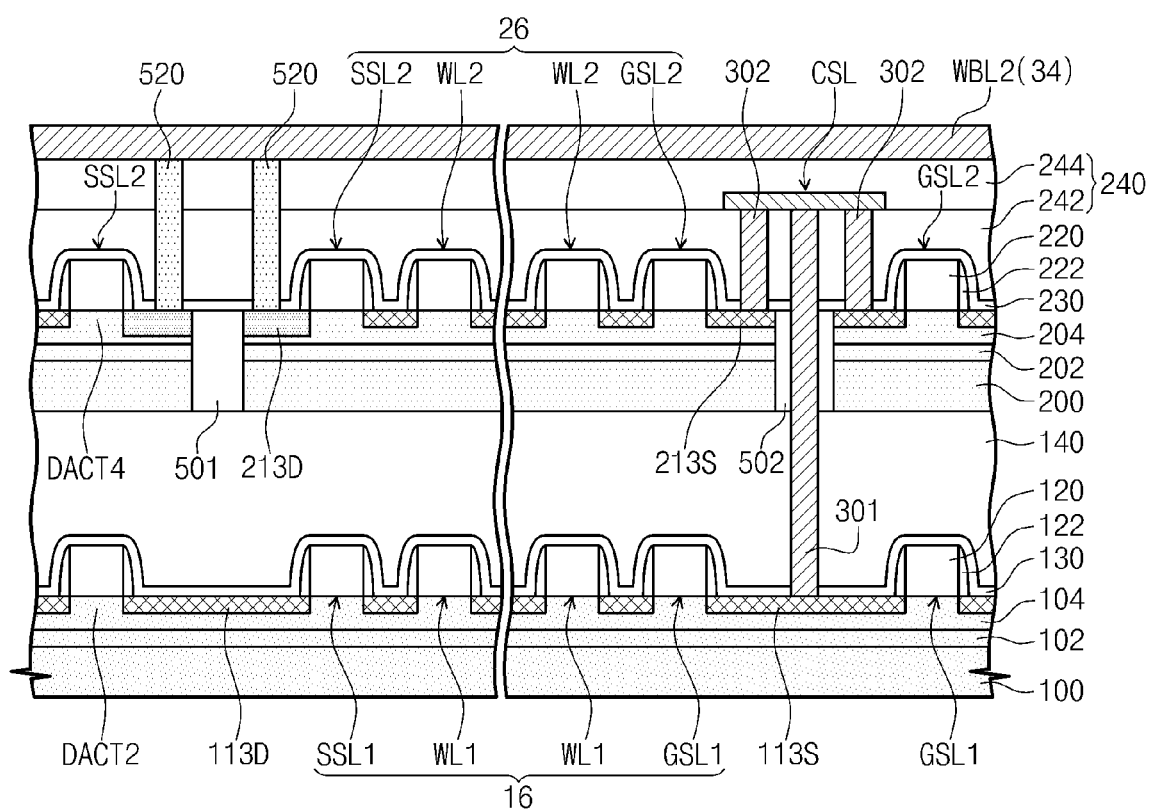
Figure 3D:
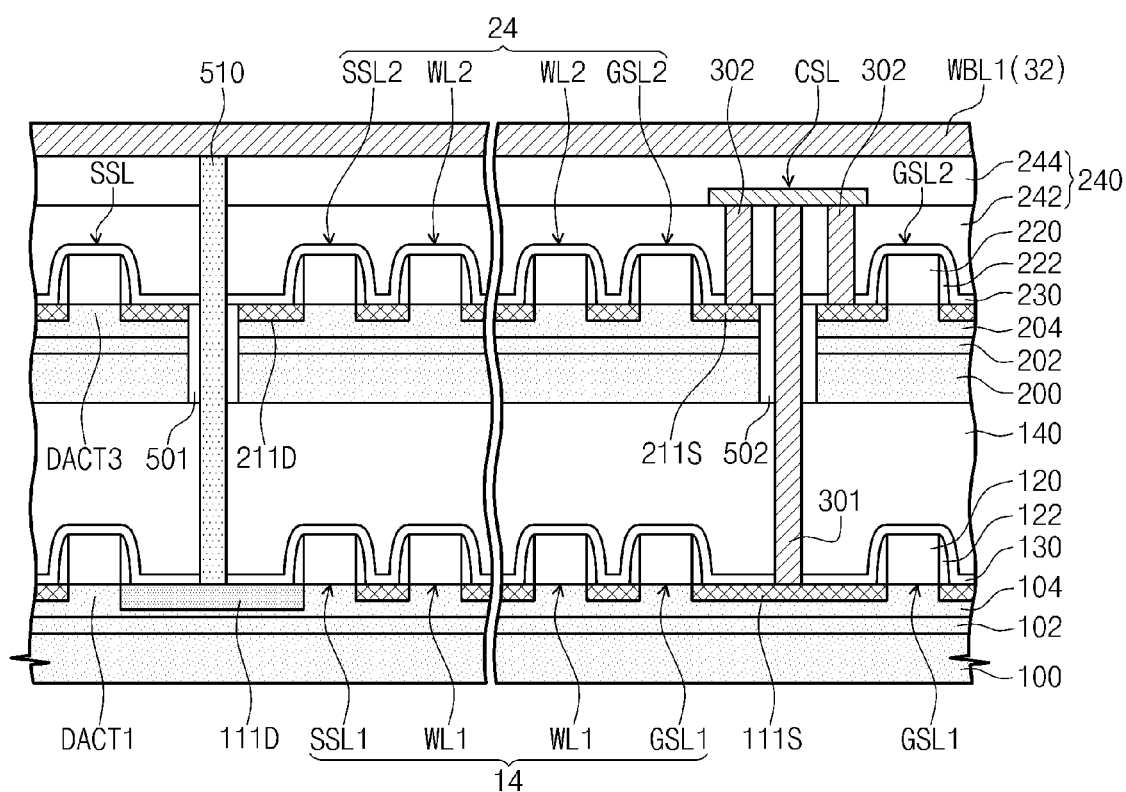

FIGS. 3A through 3D collectively illustrate a flash memory device according to an embodiment of the present invention. Specifically, FIG. 3 is a top plan view, FIG. 3B is a cross-sectional view taken along the line I-I' of FIG. 1, FIG. 3C is a cross-sectional view taken along the line II-II' of FIG. 1, and FIG. 3D is cross-sectional view taken along the line III-III' of FIG. 1.

Referring to FIG. 1 as well as FIGS. 3A through 3D, a bottom deep N-well 102 is disposed on a bottom semiconductor layer 100. A conductivity type of the bottom semiconductor layer 100 is assumed to P-type for the illustrated example. A bottom well region is formed on the bottom deep N-well 102. The conductivity of the bottom well region 104 is, according to the foregoing substrate assumption, assumed to be N-type. A body bias may be generated by applying a voltage to the bottom well region 104. The bottom well region 104 corresponds to a bottom well region 42 described with reference to FIG. 1.

The illustrated flash memory device includes dummy bottom active regions DACT1 and DACT2 and a plurality of bottom active regions ACT1 which are disposed on the bottom well region 104.

A bottom gate structure 120 is disposed on the bottom semiconductor layer 100. The bottom gate structure 120 in the illustrated embodiment includes a bottom string selection line SSL1, a bottom ground selection line GSL1, and a plurality of bottom wordlines WL1 disposed between the bottom string selection line SSL1 and the bottom ground selection line GSL1. The bottom string selection line SSL1 includes a plurality of bottom string selection transistors SST1, and the bottom ground selection line GSL1 includes a plurality of bottom ground selection transistors GST1.

Each of the bottom wordlines WL1 includes a plurality of cell transistors M1. Bottom dummy memory cell units 14 and 16 and bottom memory cell units 12 include the bottom string selection transistor SST1, the bottom ground selection transistors GST1, and a plurality of cell transistors M1 serially connected between the bottom string and ground selection transistors SST1 and GST1.

The bottom gate structure 120 includes a bottom floating electrode (not shown), a bottom blocking insulating layer (not shown), and a bottom control electrode (not shown) which are sequentially stacked in listed order. Due to the bottom blocking insulating layer of the bottom wordlines WL1, the bottom floating electrode and the bottom control electrode are not electrically connected. The bottom blocking insulating layer may be removed partially or entirely to electrically connect the bottom floating electrode and the bottom control electrode. In one more specific embodiment of the invention, the bottom gate structure 120 forms a charge trap-type structure.

Bottom dummy memory cell units 14 and 16 are disposed at the bottom dummy active regions DACT1 and DACT2, respectively. A bottom memory cell unit 12 is disposed on the bottom active region ACT1. The bottom dummy active regions DACT1 and DACT2 comprise a first bottom dummy active region DACT1 and a second bottom dummy active region DACT2. A bottom drain region 110D and a bottom source region 110S are formed at the bottom active region ACT1. Bottom dummy drain regions 111D and 113D and bottom dummy source regions 111S and 113S are formed in the bottom dummy active regions DACT1 and DACT2. The bottom source region 110S is formed at the bottom active region ACT1 adjacent to the bottom ground selection line GSL1. The bottom drain region 110D is formed at the bottom active region ACT1 adjacent to the bottom string selection line SSL1. The bottom dummy source regions 111D and 113S are formed at the bottom dummy active regions DACT1 and DACT2 adjacent to the bottom ground selection line GSL. The bottom dummy drain regions 111D and 113D are formed at the bottom dummy active regions DACT1 and DACT2 adjacent to the bottom string selection line SSL1.

Bottom gate spacers 122 are disposed on sidewalls of the bottom string selection line SSL1, the ground selection line GSL1, and the wordlines WL1. A bottom etch-stop layer 130 is disposed on the bottom gate structure 120. The bottom etch-stop layer 130 is conformally formed on bottom semiconductor layer 100 where the bottom gate structure 120 is formed. A bottom interlayer dielectric 140 is disposed on the bottom gate structure 120. Thus, the bottom etch-stop layer 130 may be formed from a material having an etch selectivity with respect to the bottom interlayer dielectric 140.

A top deep N-well 202 is disposed on top semiconductor layer 200. A top P-well region 204 is disposed on the top deep N-well 202. A body bias may be generated by applying a voltage to the top deep N-well 202. The flash memory device of the illustrated embodiment includes top dummy active regions DACT3 and DACT4 formed on the top P-well region 204. Here again, a P-type conductivity is assumed for the top semiconductor layer 200.

A top gate structure 220 is disposed over the top semiconductor layer 200. The top gate structure 220 includes a top string selection line SSL2, a top ground selection line GSL2, and a plurality of top wordlines WL2 disposed between the top string selection line SSL2 and the top ground selection line GSL2. The top string selection line SSL2 include a plurality of top string selection transistors SST2, and the top ground selection line GSL2 includes a plurality of top ground selection transistors GST2. Each of the top wordlines WL2 includes a plurality of cell transistors M2. Top dummy memory cell units 24 and 26 and top memory cell units 22 include a top string selection transistor SST2, a top ground selection transistor GST2, and a plurality of cell transistors M2 serially connected between the top string and ground selection transistors SST2 and GST2.

The top gate structure 220 includes a top floating electrode (not shown), a top blocking insulating layer (not shown), and a top control electrode (not shown) sequentially stacked in listed order. In case of the top wordline WL2, the top floating electrode and the top control electrode may not be electrically connected due to the top blocking insulating layer. In case of the top string selection line and the top ground selection line, the top blocking insulating layer may be removed partially or entirely to electrically connect the top floating electrode and the top control electrode to each other. In one more specific embodiment of the invention, the top gate structure 220 forms a charge trap-type structure.

Top dummy memory cell units 24 and 26 are disposed at the top dummy active regions DACT3 and DACT4, and top memory cell units 22 are disposed at the top active regions ACT2. In the illustrated example, a top drain region 210D and a top source region 210S are formed in the top active region ACT2. Top dummy drain regions 211D and 213D and top dummy source regions 211S and 213S are formed in the top dummy active regions DACT3 and DACT4. The top dummy active regions DACT3 and DACT4 include a first top dummy active region DACT3 and a second top dummy active region DACT4. The bottom active region ACT1 and the top active region ACT2 are vertically aligned, and the first bottom dummy active region DACT1 and the first top dummy active region DACT3 are vertically aligned. The second bottom dummy active region DACT2 and the second top dummy active region DACT4 are vertically aligned.

The top source region 210S is formed at the top active region ACT2 adjacent to the top ground selection line GSL2. The top drain region 210D is formed at the top active region ACT2 adjacent to the top string selection SSL2. The top dummy source regions 211S and 213S are formed at the top dummy active regions DACT3 and DACT4 adjacent to the top string selection line SSL2.

Top gate spacers 222 are disposed on sidewalls of the top string selection line SSL, the ground selection line GSL2, and the top wordlines WL2. A top etch-stop layer 230 is disposed on the top gate structure 220. The top etch-stop layer 230 is conformally formed on the top semiconductor layer 200 where the top gate structure 220 is formed. A first top interlayer dielectric 242 is disposed on the top gate structure 220. The top etch-stop layer 230 may be formed from a material having an etch selectivity with respect to the first top interlayer dielectric 242.

The top semiconductor layer 200 also includes a drain penetrating portion 501 on the bottom drain region 110D and the bottom dummy drain regions 111D and 113D of the bottom semiconductor layer 100. The top semiconductor layer 200 includes a source penetrating portion 502 on the bottom source region 110S and the bottom dummy source regions 111S and 113S of the bottom semiconductor layer 100. The drain penetrating portion 501 and the source penetrating portion 502 may be filled with an insulating layer, such as silicon oxide. The drain penetrating portion 501 and the source penetrating portion 502 are disposed to extend in a wordline direction in the illustrated embodiment.

Common source line contact pugs 302 are disposed on the top source region 210S of the top active region ACT2 and the top dummy source regions 211S and 213S of the top dummy active regions DACT3 and DACT4, respectively. An N-type conductivity is assumed for the top source region 210S and the top dummy source regions 211S and 213S. Bottom common source line contact plugs 304 are disposed on the bottom source region 110S of the bottom active region ACT1 and the bottom dummy source regions 111S and 113S of the bottom dummy active regions DACT3 and DACT4, respectively. An N-type conductivity is also assumed for the bottom source region 110S and the bottom dummy source regions 111S and 113S. The bottom common source line contact plug 301 is disposed to penetrate the source penetrating portion 502. A common source line CSL is disposed on the bottom common source line contact plug 301 and the top common source line contact plug 302. The common source line CSL may be electrically connected to the top source region 210S and the top dummy source regions 211S and 213S through the bottom common source line contact plug 301 and the top common source line contact plug 302.

A second top interlayer dielectric 244 is disposed on the common source line CSL. A top surface of the second top interlayer dielectric 244 may be planarized. A top bitline contact plug 402 is disposed on the top drain region 210D of the top active region ACT2. A bottom bitline contact plug 401 is disposed on the bottom drain region 110D of the bottom active region ACT. The bottom bitline contact plug 401 may be electrically connected to the bottom drain region 110D, and the top bitline contact plug 402 may be electrically connected to the top drain region 210D. The bottom bitline contact plug 401 is disposed to penetrate the drain penetrating portion 501. A bitline BL is electrically connected to the top bitline contact plug 402 and the bottom bitline contact plug 401.

A top well bias line contact plug 520 is disposed on the top dummy drain region 213D of the second top dummy active region DACT4. The top dummy drain region 213D may be doped with impurities having the same conductivity type as the top well region 204. Thus, the conductivity type of the top dummy drain region 213D is assumed to be P-type. The top well bias line contact plug 520 is electrically connected to the top dummy drain region 213D.

A bottom well bias line contact plug 510 is disposed on the bottom dummy drain region 111D of the first bottom dummy active region DACT1. The bottom dummy drain region 111D is assumed to have the same conductivity type as the bottom well region 104. Thus, the conductivity type of the bottom dummy drain region 111D is assumed to be P-type. The bottom well bias line contact plug 510 is electrically connected to the bottom dummy drain region 111D. The bottom well bias line contact plug 510 is disposed to penetrate the drain penetrating portion 501. A bottom well bias line (WBL1) 32 is electrically connected to the bottom well bias line contact plug 510, and a top well bias line (WBL2) 34 is electrically connected to the top well bias line contact plug 520. In the illustrated embodiment, the well bias lines and the bitline BL are disposed in a coplanar manner.

Figure 4A:
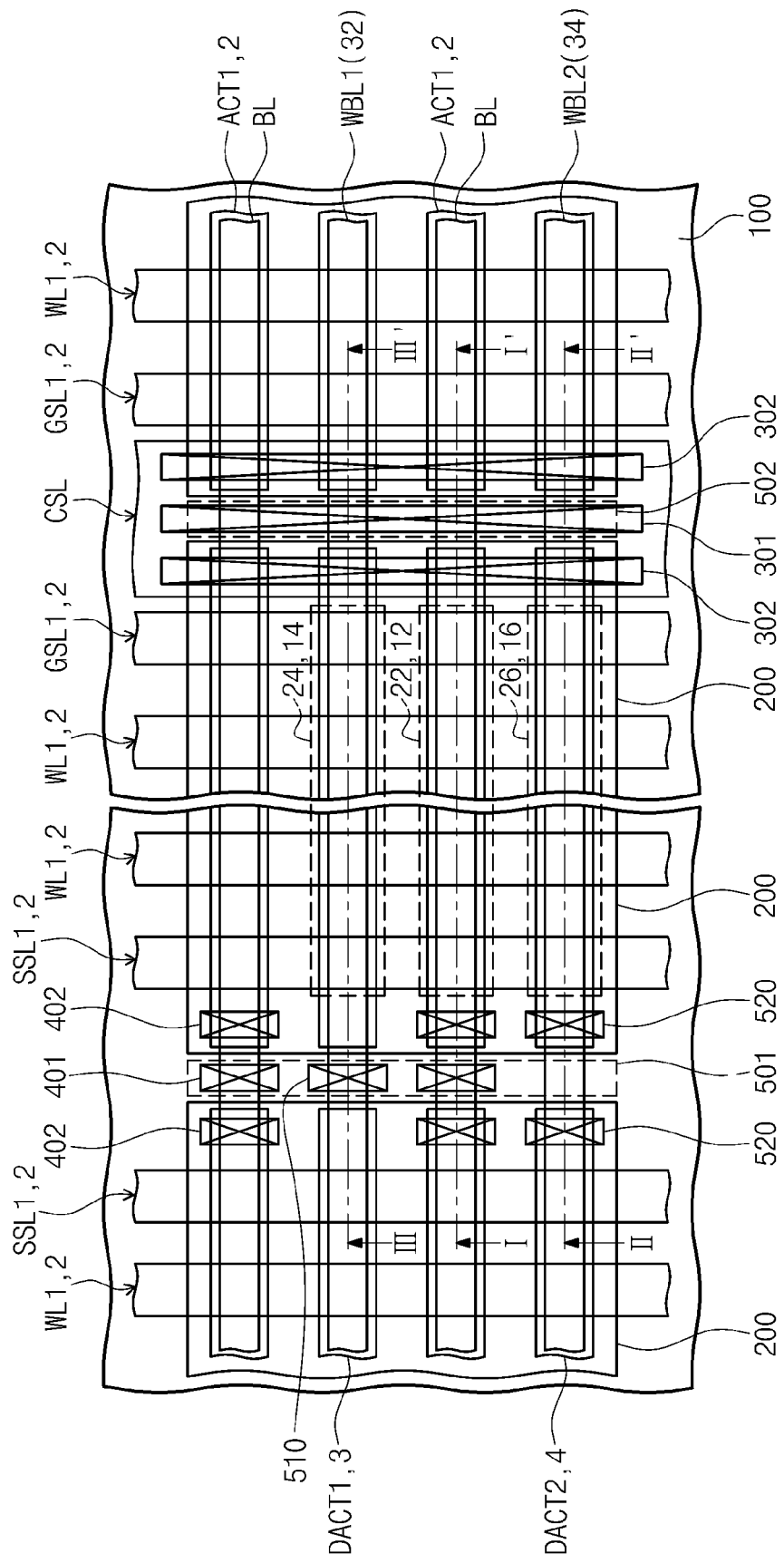
FIGS. 4A through 4D illustrate a flash memory device according to another embodiment of the invention.
Figure 4B:
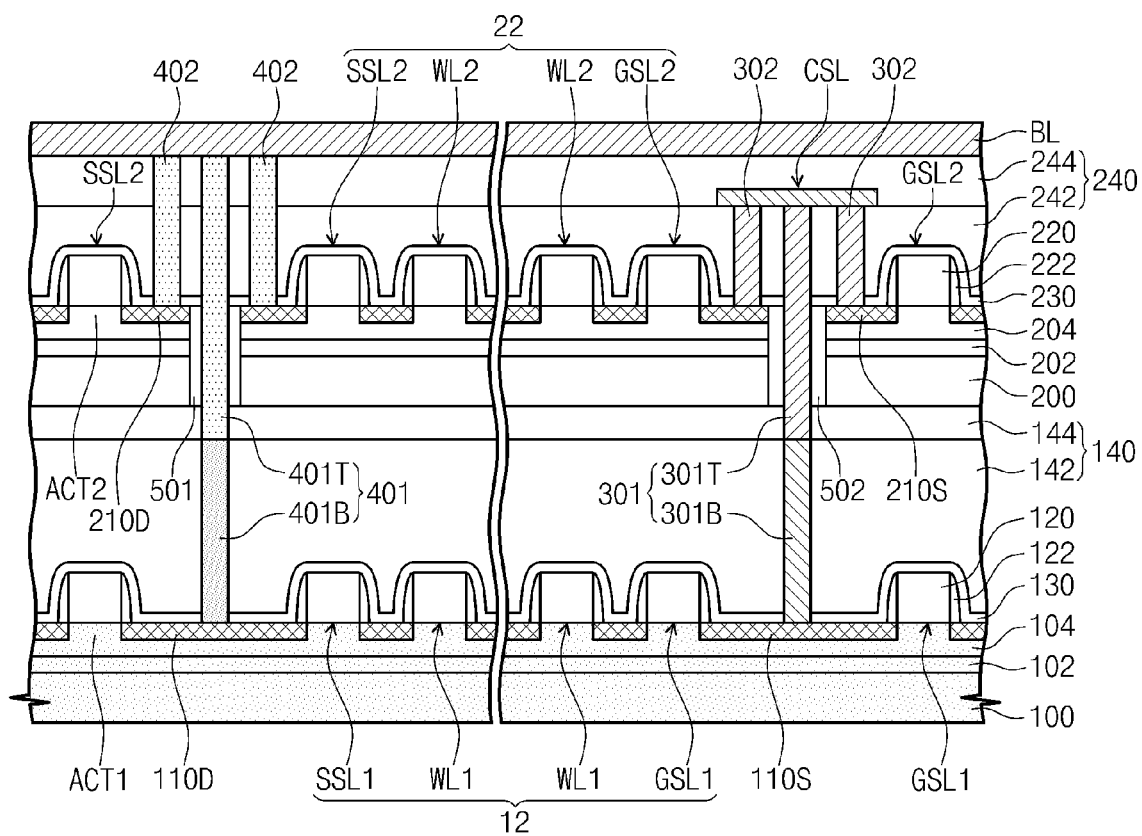
Figure 4C:
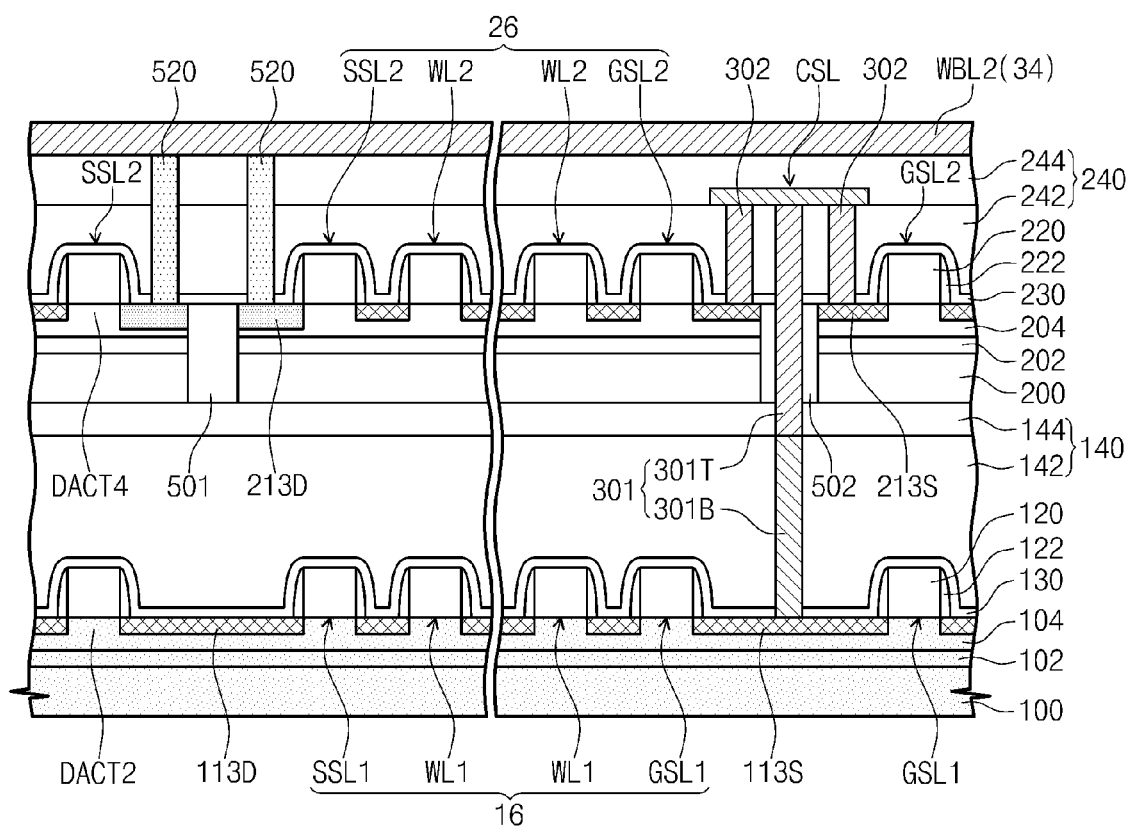
Figure 4D:
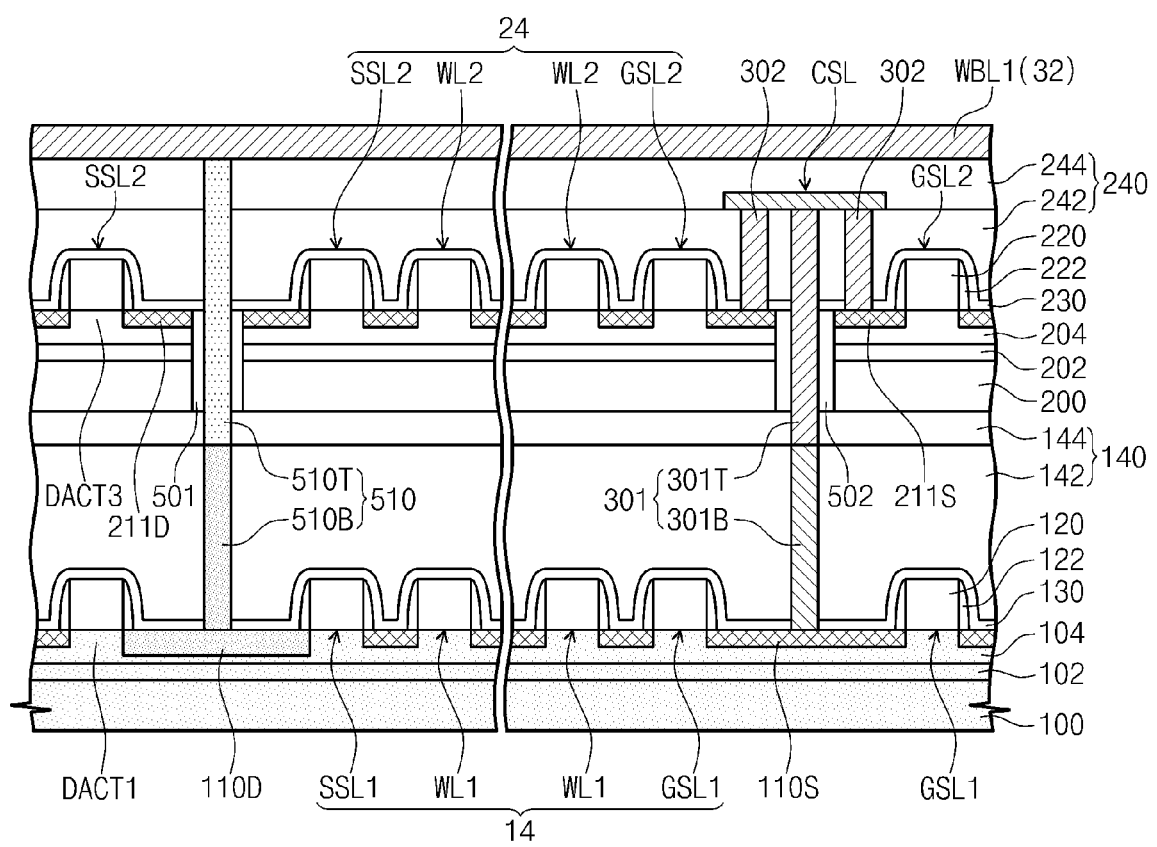

FIGS. 4A through 4D illustrate a flash memory device according to another embodiment of the invention. Specifically, FIG. 4A is a top plan view, FIG. 4B is a cross-sectional view taken along the line I-I' of FIG. 4A, FIG. 4C is a cross-sectional view taken along the line II-II' of FIG. 4A, and FIG. 4D is a cross-sectional view taken along the line III-III' of FIG. 4A. Duplicate explanations with respect to similar elements, features and relationships already described in relation to FIG. 3 will be omitted.

Referring to FIG. 1 and FIGS. 4A through 4D, a bottom interlayer dielectric 140 includes a first bottom interlayer dielectric 142 and a second bottom interlayer dielectric 144. A bottom common source line contact plug 301 is disposed to penetrate a source penetrating portion 502. The bottom common source line contact plug 301 is divided into a first bottom common source line contact plug 301B and a second bottom common source line contact plug 301T. A top surface of the first bottom common source line contact plug 301B may match that of the first bottom interlayer dielectric 142.

A bottom bitline contact plug 401 includes a first bottom bitline contact plug 401B and a second bottom bitline contact plug 401T. A top surface of the first bottom bitline contact plug 401B may match that of the first bottom interlayer dielectric 142.

The bottom well bias line contact plug 510 includes a first bottom well bias line contact plug 510B and a second bottom well bias line contact plug 510T. A top surface of the first bottom well bias line contact plug 510B may match that of the first bottom interlayer dielectric 142.

Figure 5A:
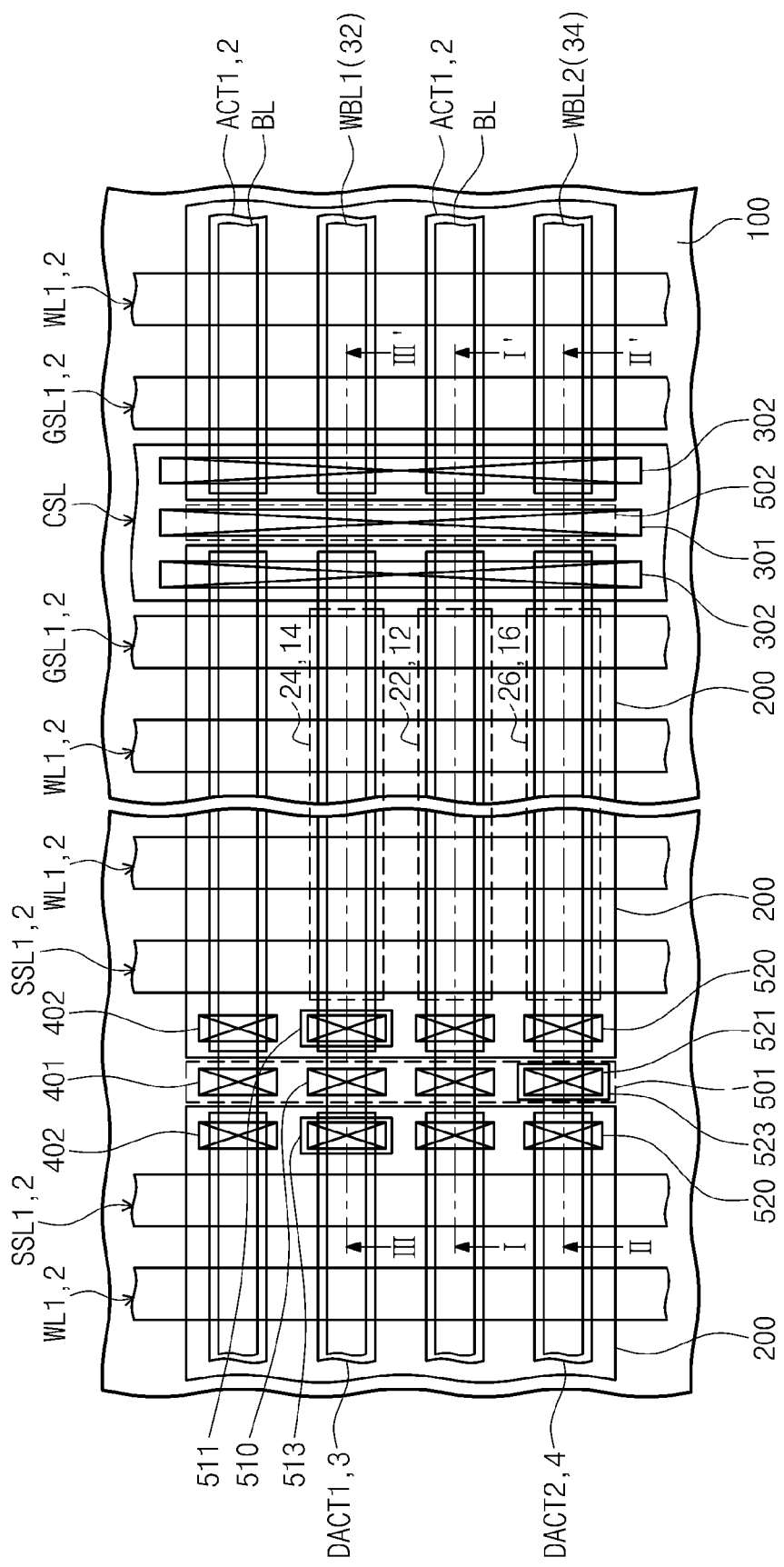
FIGS. 5A through 5D illustrate a flash memory device according to yet another embodiment of the invention.
Figure 5B:
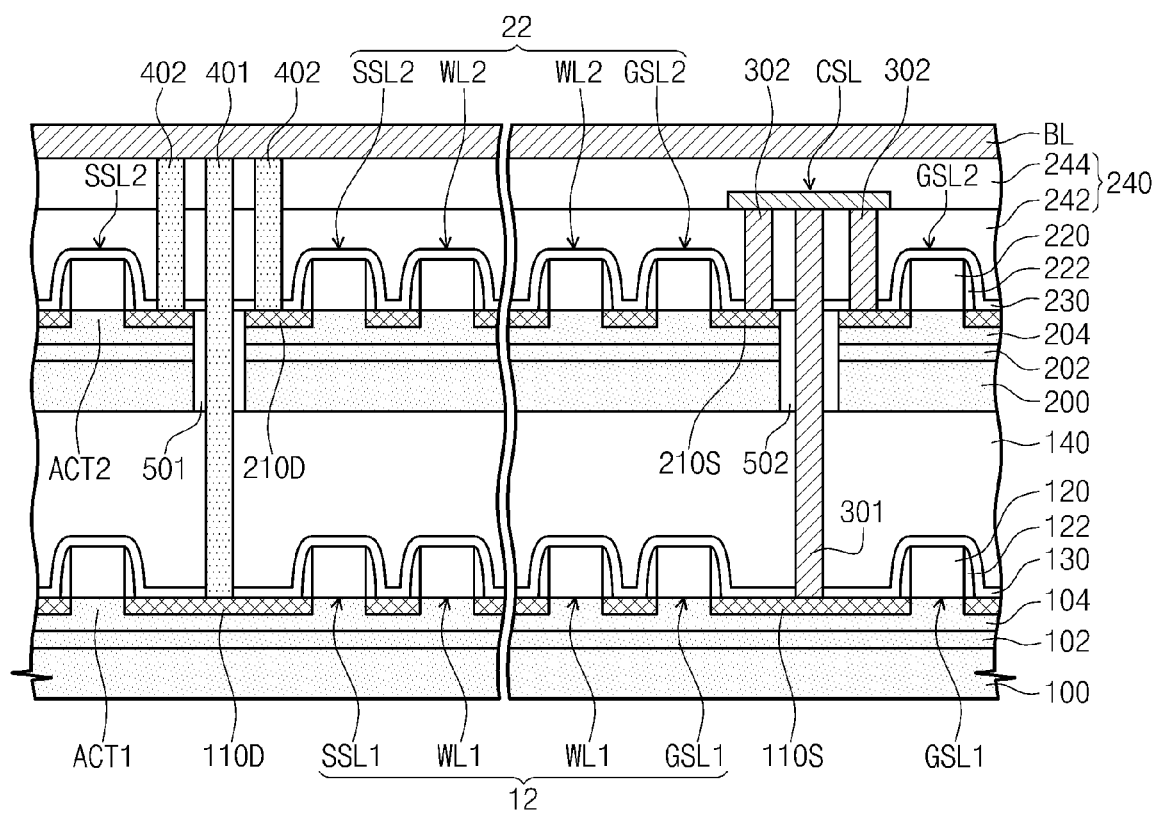
Figure 5C:
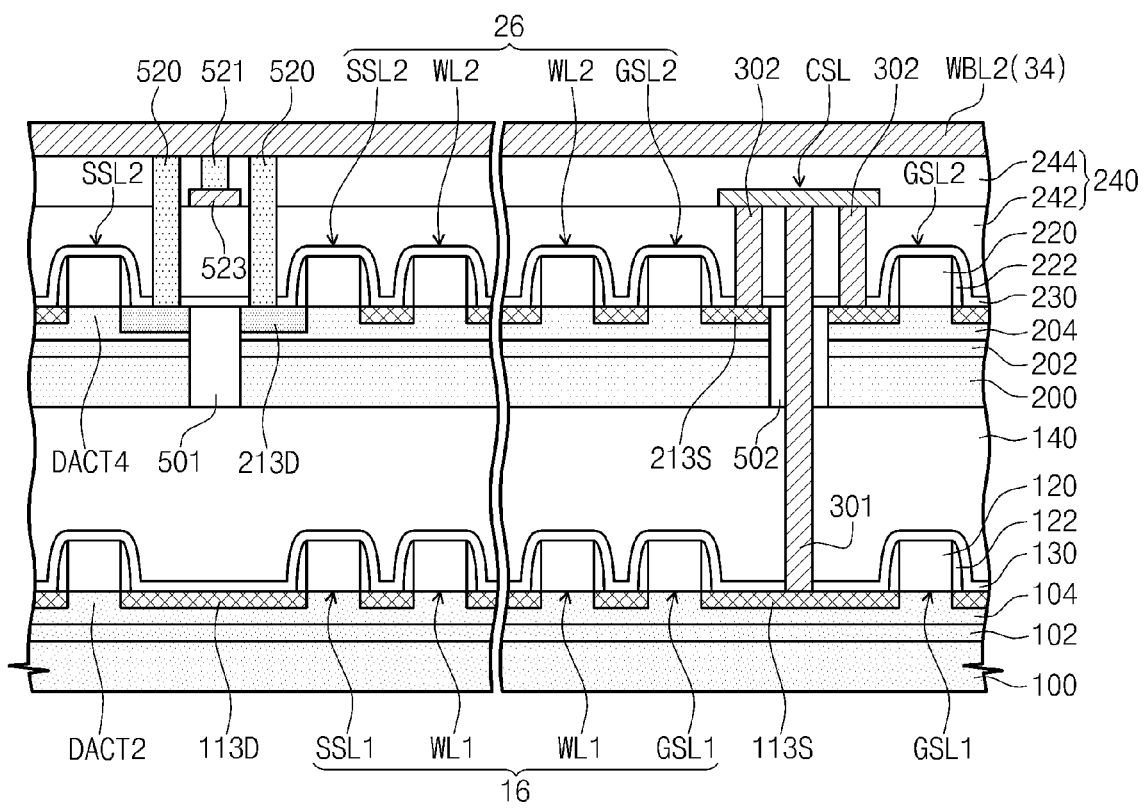
Figure 5D:
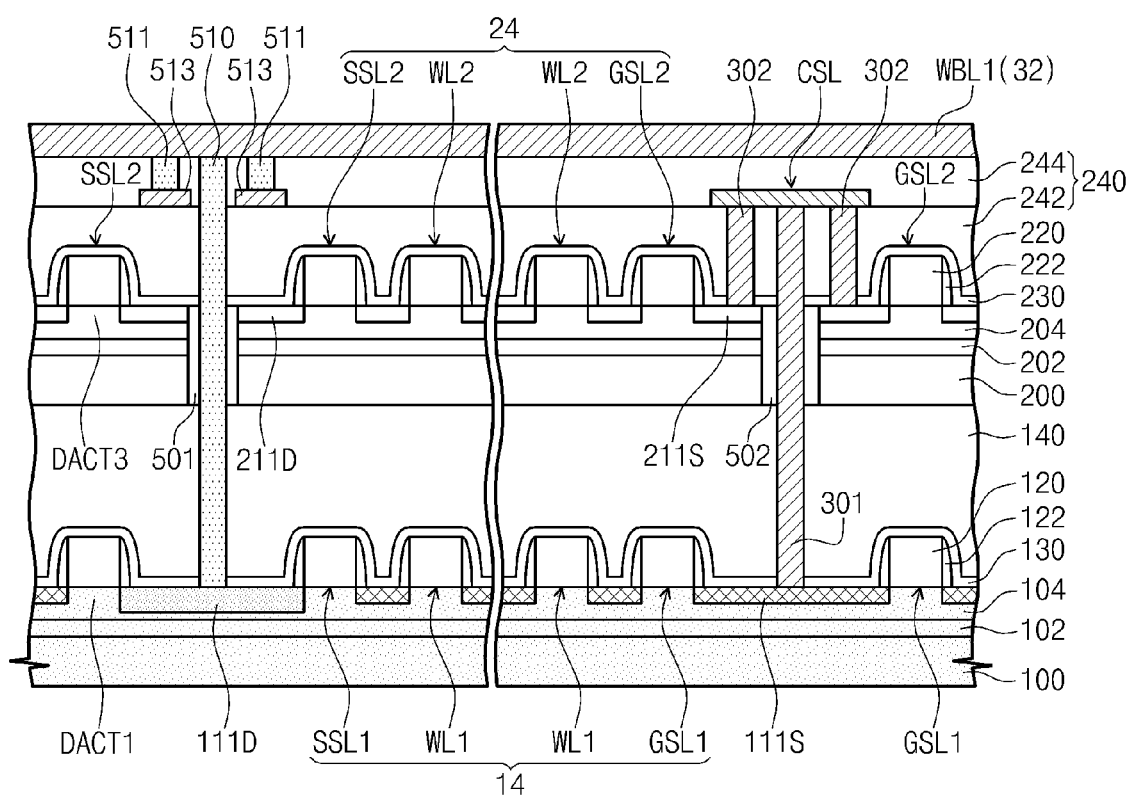

FIGS. 5A through 5D illustrate a flash memory device according to yet another embodiment of the invention. Specifically, FIG. 5A is a top plan view, FIG. 5B is a cross-sectional view taken along the line I-I' of FIG. 5A, FIG. 5C is a cross-sectional view taken along the line II-II' of FIG. 5A, and FIG. 5D is a cross-sectional view taken along the line III-III' of FIG. 5A. Duplicate explanations with respect to similar elements, features and relationships already described in relation to FIG. 3 will be omitted.

Referring to FIG. 1 and FIGS. 5A through 5D, bitline contact plugs 401 and 402 and/or well bias line contact plugs 510 and 520 are disposed on a top interlayer dielectric 240. In this case, well bias dummy contact plugs 511 and 521 may be provided to secure reproducibility and reliability of photolithography and/or etching. The well bias dummy contact plugs 511 and 521 are disposed on etch-stop pads 513 and 523 disposed on the first top interlayer dielectric 242, respectively. The etch-stop pads 513 and 523 may be simultaneously formed with a common source line CSL.

Figure 6A:
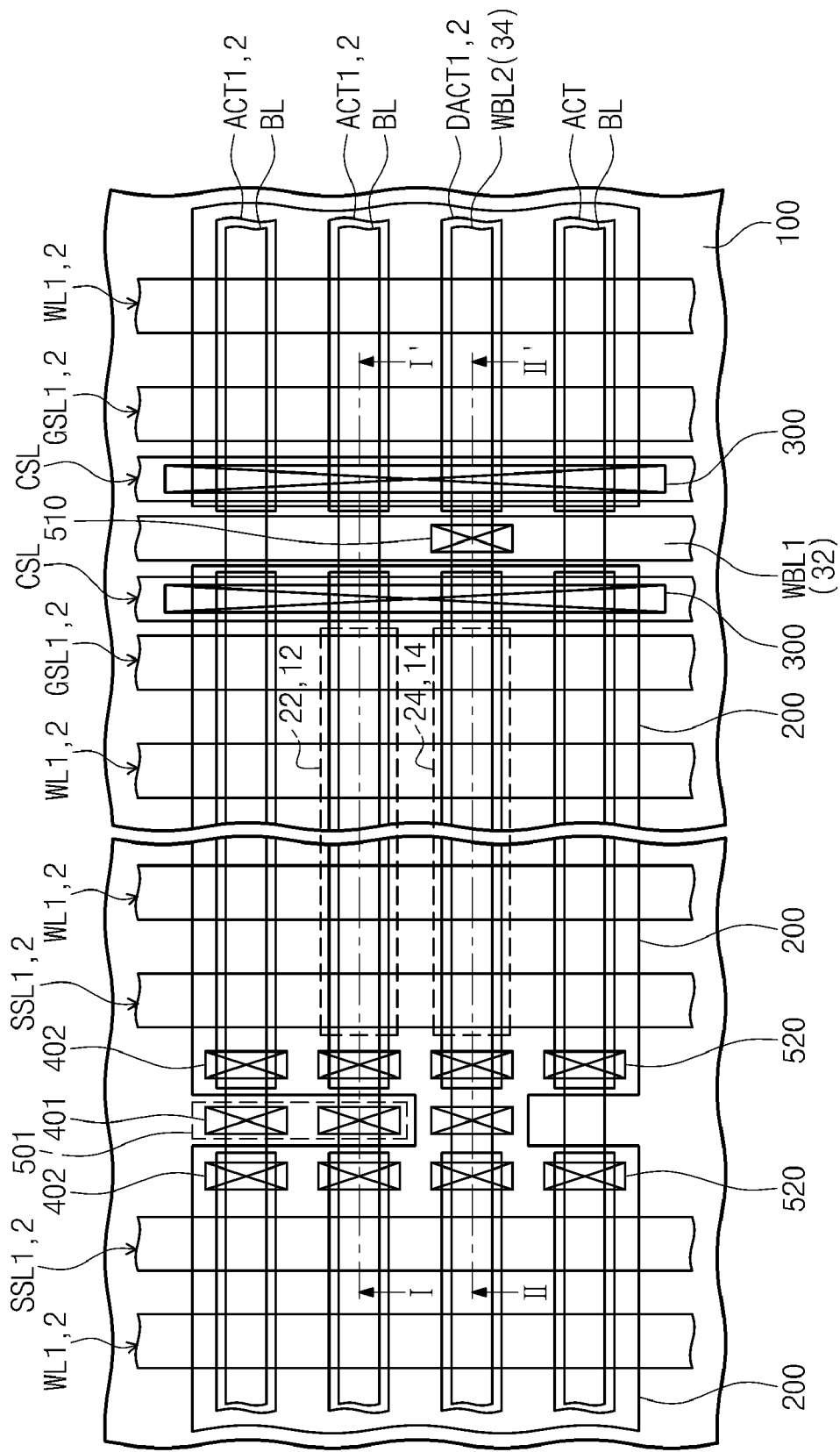
FIGS. 6A through 6C illustrate a flash memory device according to yet another embodiment of the invention.
Figure 6B:
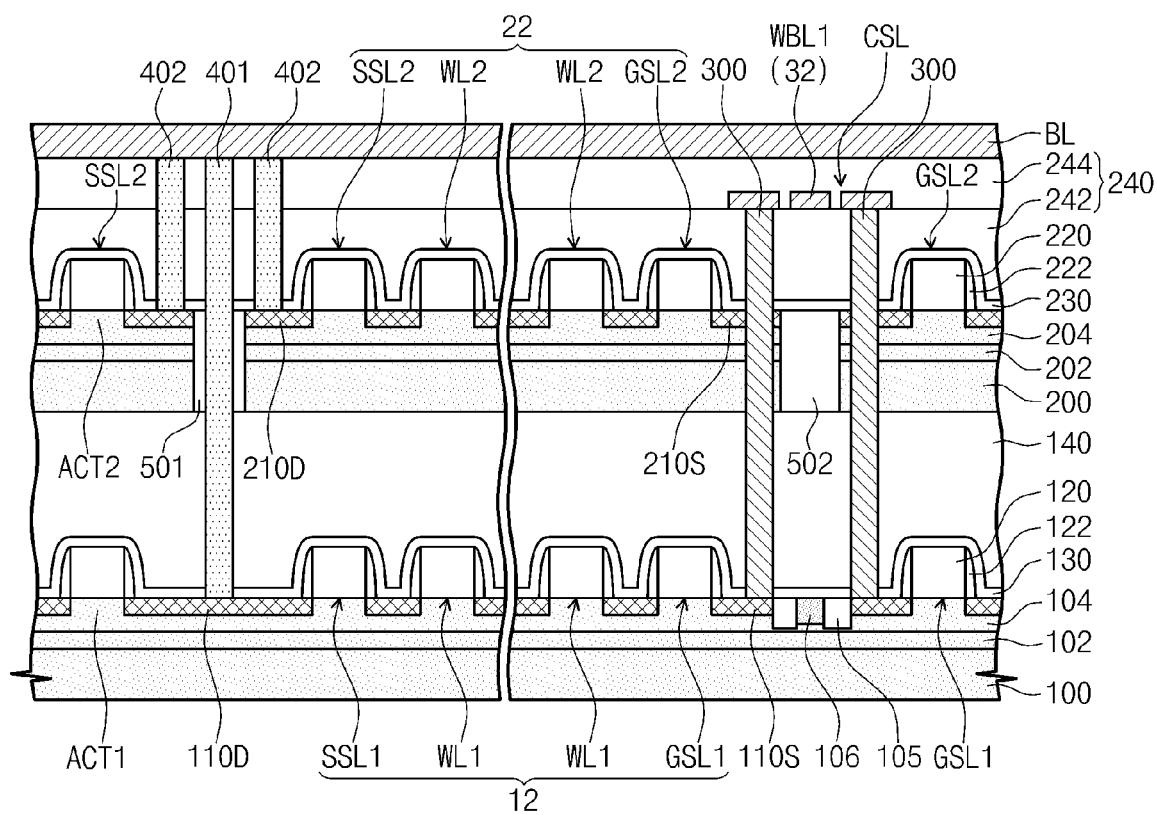
Figure 6C:
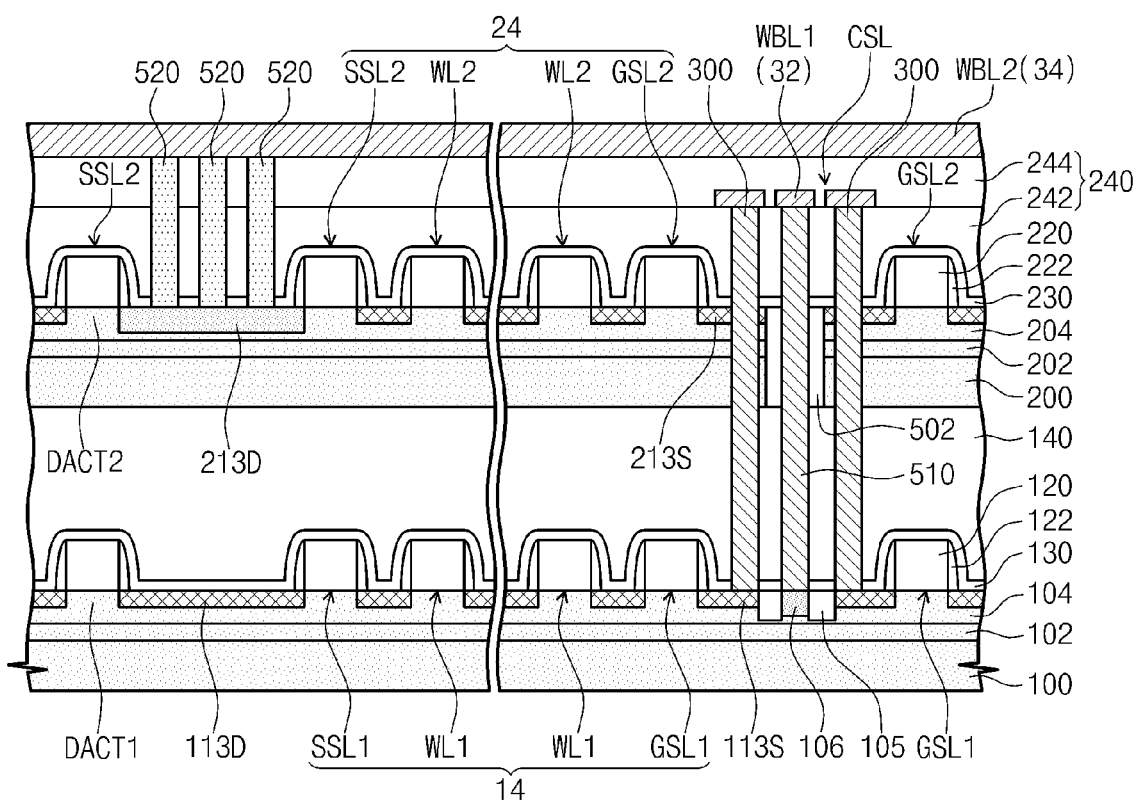

FIGS. 6A through 6C illustrate a flash memory device according to yet another embodiment of the invention. Specifically, FIG. 6A is a top plan view, FIG. 6B is a cross-sectional view taken along the line I-I' of FIG. 6A, and FIG. 6C is a cross-sectional view taken along the line II-II' of FIG. 6A.

Referring to FIG. 2 and FIGS. 6A through 6C, a bottom deep N-well 102 is disposed on a bottom semiconductor layer 100. A bottom well 104 is formed on the bottom deep N-well 102. The conductivity type of the bottom well 104 is N-type given an assumption that the bottom semiconductor layer 100 is P-type. A body bias may be generated by applying a voltage to the bottom well 104. The flash memory device according to the illustrated embodiment includes the bottom semiconductor layer 100 having a bottom well 104 and a dummy bottom active region DACT1 and a plurality of bottom active regions ACT1 formed on the bottom well 104.

A bottom gate structure 120 is disposed over the bottom semiconductor layer 100. The bottom gate structure 120 include a bottom string selection line SSL1, a bottom ground selection line GSL1, and a plurality of bottom wordlines WL1 coupled between the bottom string selection line SSL1 and the bottom ground selection line GSL1. The bottom string selection line SSL1 includes a plurality of bottom ground selection transistors GST1. Each of the bottom wordlines WL1 includes a plurality of cell transistors M1. A bottom dummy memory cell unit 14 and bottom memory cell units 12 include the bottom string selection transistor SST1, the bottom ground selection transistor GST1, and a plurality of cell transistors M1 serially connected between the bottom string and ground selection transistors SST1 and GST1.

The bottom gate structure 120 includes a bottom floating electrode (not shown), a bottom blocking insulating layer (not shown), and a bottom control electrode (not shown) sequentially stacked in listed order. Due to the bottom blocking insulating layer of the bottom wordlines WL1, the bottom floating electrode and the bottom control electrode are not electrically connected. The bottom string selection line SSL1 and the bottom ground selection line GSL1 may be removed partially or entirely to electrically connect the bottom floating electrode and the bottom control electrode. In one specific embodiment of the invention, the bottom gate structure 120 forms a charge trap-type structure.

The bottom dummy memory cell unit 14 is disposed at the bottom dummy active region DACT1, and the bottom memory cell unit 12 is disposed on the bottom active region ACT1. A bottom drain region 110D and a bottom source region 110S are formed in the bottom active region ACT1. A bottom dummy drain region 113D and a bottom dummy source region 113S are formed in the bottom dummy active region DACT1. The bottom source region 110D is formed at the bottom active region ACT1 adjacent to the bottom ground selection line GSL1. The bottom drain region 110D is formed at the bottom active region ACT1 adjacent to the bottom string selection line SSL1. The bottom dummy source region 113S is formed at the bottom dummy active region DACT1 adjacent to the bottom ground selection line GSL1. The bottom dummy drain region 113D is formed at the bottom dummy active region DACT1 adjacent to the bottom string selection line SSL1.

An isolation well region 106 is formed in the bottom source region 110S and the bottom dummy source region 113S of the bottom semiconductor layer 100. The isolation well region 106 is electrically isolated from the bottom source region 110S and the bottom dummy source region 113S by a device isolation layer 105, which may be formed, for example using a conventionally understood shallow trench isolation (STI) process. The conductivity type of the isolation well region 106 is opposite that of the bottom source region 110S (or P-type in the working example).

Bottom gate spacers 122 are disposed on sidewalls of the bottom string selection line SSL1, the ground selection line GSL1, and the bottom wordlines WL1. A bottom etch-stop layer 130 is disposed on the bottom gate structure 120. The bottom etch-stop layer 130 is conformally formed on the bottom semiconductor layer 100 where the bottom gate structure 120 is formed. A bottom interlayer dielectric 140 is disposed on the bottom gate structure 120. The bottom etch-stop layer 130 is formed from a material having an etch selectivity with respect to the bottom interlayer dielectric 140.

A top deep N-well 202 is disposed on the top semiconductor layer 200. A top well region 204 is disposed on the top deep N-well 202. A body bias may be generated by applying a voltage to the top well region 204. The flash memory device includes the top semiconductor layer 200 including the top well region 204, a top dummy active region DACT2 formed on the top well region 204, and a plurality of top active regions ACT2. Here again, the conductivity type for the top semiconductor layer 200 is assumed to be P-type.

A top gate structure 220 is disposed over the top semiconductor layer 200. The top gate structure 220 includes a top string selection line SSL2, a top ground selection line GSL2, and a plurality of top wordlines WL2 coupled between the top string selection line SSL2 and the top ground selection line GSL2. The top string selection line SSL2 includes a plurality of top string selection transistors SST2. The top ground selection line GSL2 includes a plurality of top ground selection transistors GST2. Each of the wordlines WL2 includes a plurality of cell transistors M2. The dummy memory cell unit 24 and top memory cell units 22 include a top string selection transistor SST2, a top ground selection transistor GST2, and a plurality of cell transistors M2 coupled between the top string and dummy selection transistors SST2 and GST2.

The top gate structure 220 include a top floating electrode (not shown), a top blocking insulating layer (not shown), and a top control electrode (not shown) sequentially stacked in listed order. In the top wordlines WL2, the top floating electrode and the top control electrode may not be electrically connected due to the top blocking insulating layer. In case of the top string and ground selection lines SST2 and GST2, the top blocking insulating layer may be removed partially or entirely to electrically connect the top floating electrode and the top control electrode. In one specific embodiment of the invention, the top gate structure 200 forms a charge trap-type structure.

A top dummy memory cell unit 24 is disposed on the top dummy active region DACT2, and top memory cell unit 22 is disposed at the top active regions ACT2. A top drain region 210D and a top source region 210S are formed in the top active region ACT2. A top dummy drain region 213D and a top dummy source region 213S are formed in the top dummy active region DACT2. The bottom active region ACT1 and the top active region ACT2 are vertically aligned. The bottom dummy active region DACT1 and the top dummy active region DACT2 are vertically aligned.

The top source region 210S is formed at the top active region ACT2 adjacent to the top ground selection line GSL2. The top drain region 210D is formed at the top active region ACT2 adjacent to the top string selection line SSL2. The top dummy source region 213S is formed at the top dummy active region DACT2 adjacent to the top ground selection line GSL2. The top dummy drain region 213D is formed at the top dummy active region DACT2 adjacent to the top string selection line SSL2.

Top gate spacers 222 are disposed on sidewalls of the top string selection line SSL2, the top ground selection line GSL2, and the top wordlines WL2. A top etch-stop layer 230 is disposed on the top gate structure 220. The etch-stop layer 230 is conformally formed on the top semiconductor layer 200 where the top gate structure 220 is formed. A first top interlayer dielectric 242 is disposed on the top gate structure 220. The etch-stop layer 230 may be formed from a material having an etch selectivity with respect to the first top interlayer dielectric 242.

The top semiconductor layer 200 includes a drain penetrating portion 501 on the bottom drain region 100D of the bottom semiconductor layer 100. Further, the top semiconductor layer 200 includes a source penetrating portion 502 on the isolation well region 106 of the bottom semiconductor layer 100. In one embodiment of the invention, the drain penetrating portion 501 is disposed to extend in a wordline direction, and the source penetrating portion 502 is disposed on the isolation well region 106 of the bottom semiconductor layer 100 in the wordline direction.

A common source line contact plug 300 is disposed on the bottom active region 110S of the top active region ACT2 through the top source region 210S of the top active region ACT2. The common source line contact plug 300 is electrically connected to the bottom active region 110S. A common source line CSL is disposed on the common source line contact plug 300 and is electrically connected to the common source line contact plug 300.

A second interlayer dielectric 244 is disposed on the common source line CSL. A top surface of the second interlayer dielectric 244 may be planarized. A top bitline contact plug 402 is disposed on the top drain region 210D of the top active region ACT2. A bottom bitline contact plug 401 is disposed on the bottom drain region 110D of the bottom active region ACT1. The bottom bitline contact plug 401 is electrically connected to the bottom drain region 110D. The top bitline contact plug 402 is electrically connected to the top drain region 210D. The bottom bitline contact plug 401 is disposed to penetrate the drain penetrating portion 501. A bitline BL is electrically connected to the top bitline contact plug 402 and the bottom bitline contact plug 401.

A top well bias line contact plug 520 is disposed on a top dummy drain region 213D of the top dummy active region DACT2. The top well bias line contact plug 520 is electrically connected to the top dummy drain region 213D. In the illustrated embodiment, the top dummy drain region 213D is doped with impurities having the same conductivity type as the top well region 204 (or P-type in the working example).

A bottom well bias line contact plug 510 is disposed on the isolation well region 106 of a bottom dummy active region DACT1. The isolation well region 106 may have the same conductivity type as the bottom well region 104 (or P-type in the working example). The bottom well bias line contact plug 510 is electrically connected to the isolation well region 106.

The bottom well bias line contact plug 510 is disposed to penetrate the drain penetrating portion 501. A bottom well bias line (WBL1) 32 is electrically connected to the bottom well bias line contact plug 510, and a top well bias line (WBL2) 34 is electrically connected to the top well bias line contact plug 520. The top well bias line 32 and the bitline BL are disposed in a coplanar manner. The bottom well bias line 32 and the well bias line 34 are disposed to intersect with each other in different planes. Over certain embodiments of the invention, the number and shape of the top bias line contact plugs may be varied widely.

A method of fabricating a flash memory device according to an embodiment of the invention, such as the one illustrated in FIG. 3, will now be described in some additional detail.

Figure 7A:
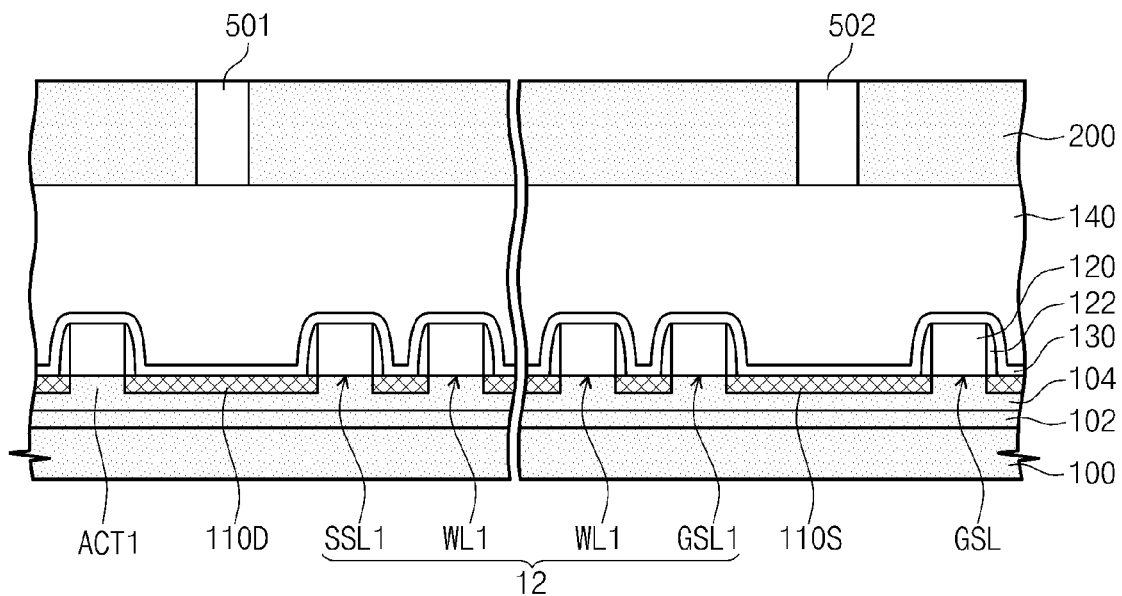
FIGS. 7A through 7C illustrate a method of fabricating a flash memory device according to an embodiment of the invention.
Figure 7B:
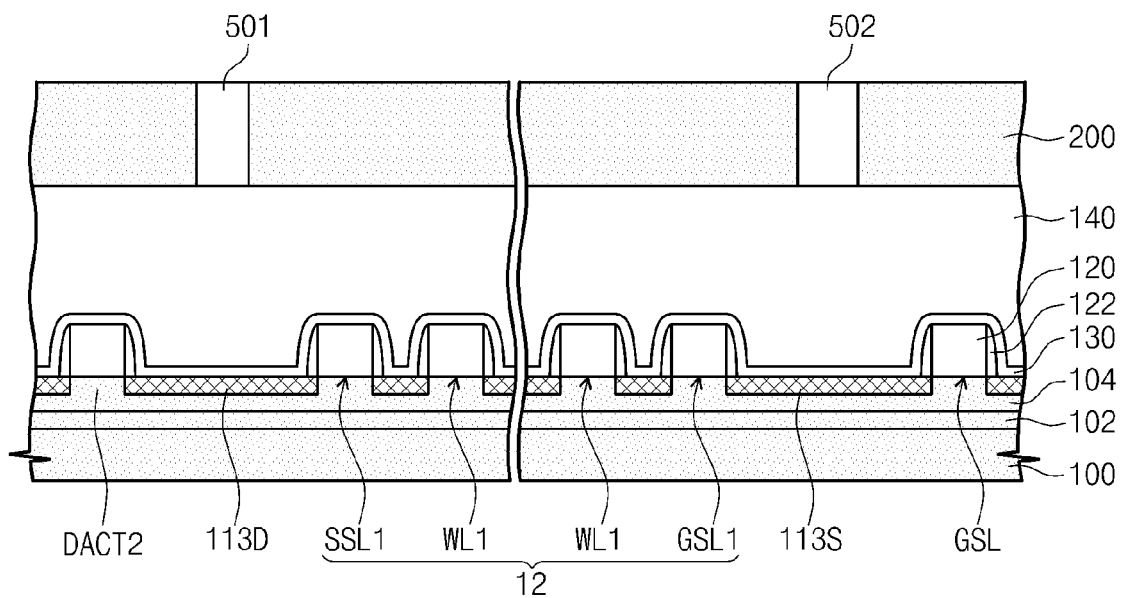
Figure 7C:
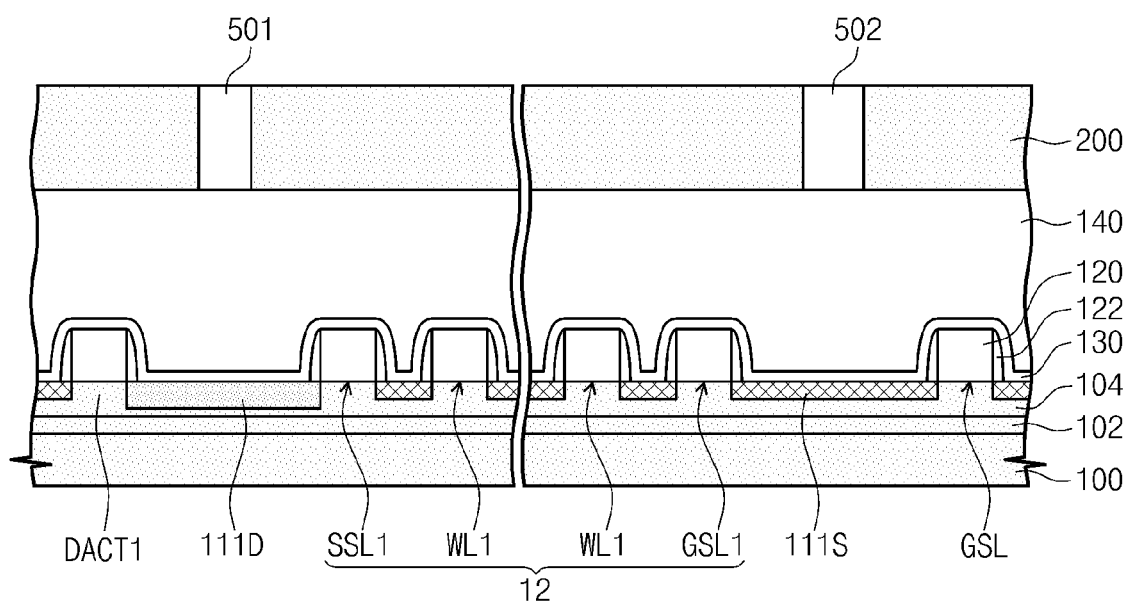

FIGS. 7A through 7C illustrate a method of fabricating a flash memory device according to an embodiment of the invention. Specifically, FIG. 7A is a cross-sectional view taken along the line I-I' of FIG. 3A, FIG. 7B is a cross-sectional view taken along the line II-II' of FIG. 3A, and FIG. 7C is a cross-sectional view taken along the line III-III' of FIG. 3A.

Referring to FIGS. 7A through 7C, a bottom deep well 102 and a bottom well 104 are formed in a bottom semiconductor layer 100. The bottom deep well 102 and the bottom well 104 may be formed using a conventionally understood ion implantation process. A trench (not shown) may be formed by patterning the bottom semiconductor layer 100 to form a bottom active region ACT1 and bottom dummy active regions DACT1 and DACT2. The bottom dummy active regions DACT1 and DACT2 comprise a first bottom dummy active region DACT1 and a second bottom dummy active region DACT2. The trench may be filled with a device isolation layer (not shown), which may be formed using a conventionally understood shallow trench isolation (STI) process or a self-aligned STI process. In this manner, a bottom gate structure 120 is formed. A bottom gate spacer 122 is formed on a sidewall of the bottom gate structure 120. A bottom etch-stop layer 130 is then conformally formed on the entire surface of the bottom gate structure 120.

Following formation of the bottom gate structure 120, an N-type ion implantation process is performed to form a bottom source region 110S and a bottom drain region 110D at the bottom active region ACT1. A bottom dummy drain region 111D of the first bottom dummy active region DACT1 is now opened using a conventional photoresist mask. In this case, a bottom dummy drain region 113D of the second bottom dummy active region DACT2 is also opened. The bottom dummy drain region 111D of the first bottom active region DACT1 may be doped with the same impurity type as the top well 104. A bottom interlayer dielectric 140 is formed on the top gate structure 120. A top surface of the bottom interlayer dielectric 140 may then be planarized, if desired, using a conventional chemical mechanical polishing (CMP) process.

A top semiconductor layer 200 is now disposed on the bottom interlayer dielectric 140. The top semiconductor layer 200 may be so disposed using a conventional bonding technique. The top semiconductor layer 200 may be planarized, if needed. The top semiconductor layer 200 is then patterned to form a drain penetrating portion 501 and a source penetrating portion 502. The drain penetrating portion 501 and the source penetrating portion 502 are planarized after being filled with (e.g.,) a silicon oxide layer.

Figure 8A:
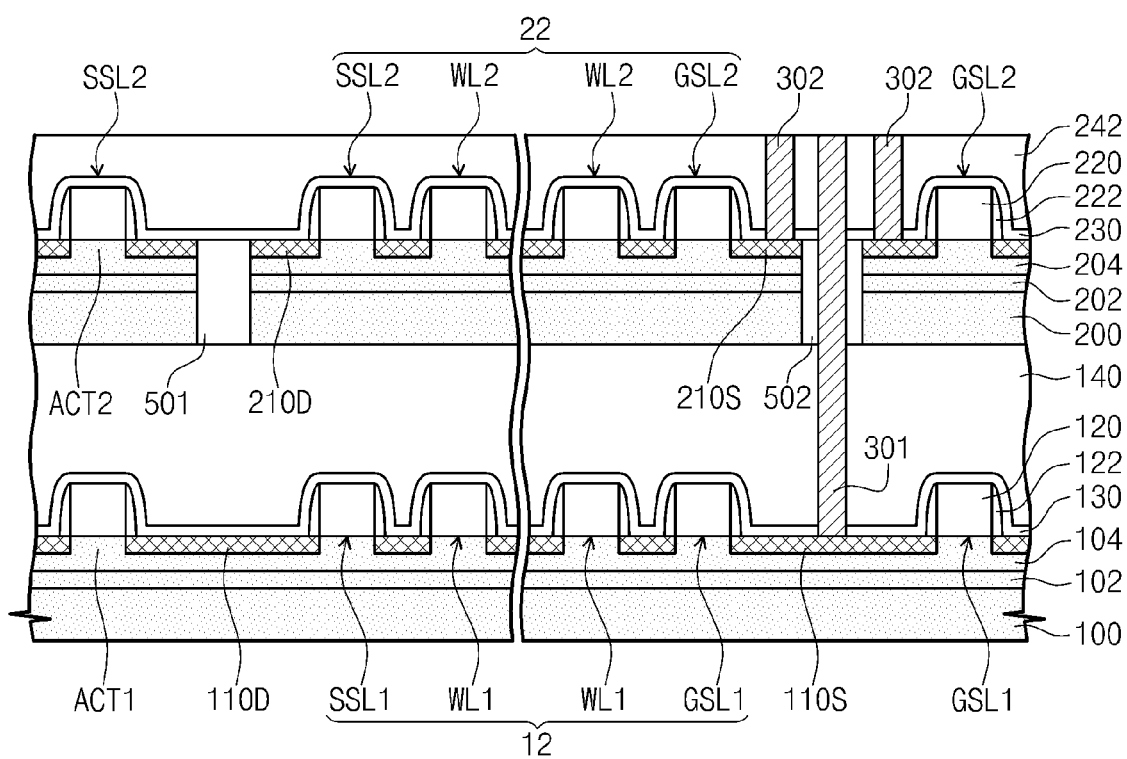
FIGS. 8A through 8C illustrate a method of fabricating a flash memory device according to an embodiment of the invention.
Figure 8B:
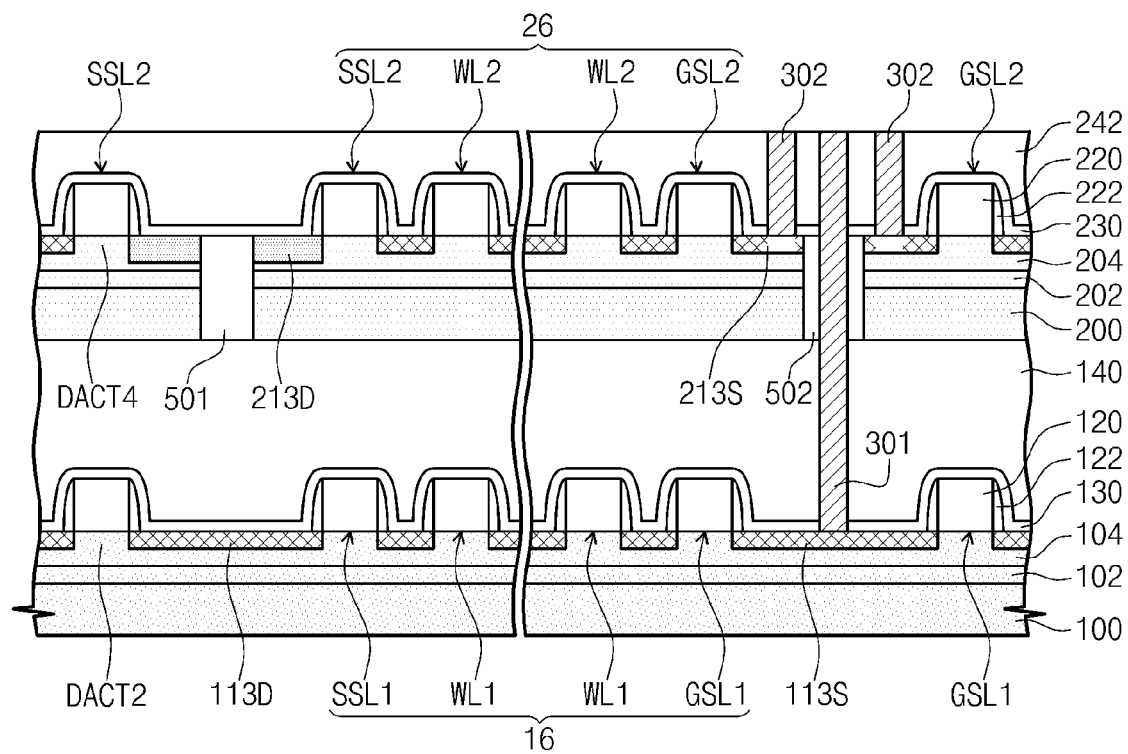
Figure 8C:
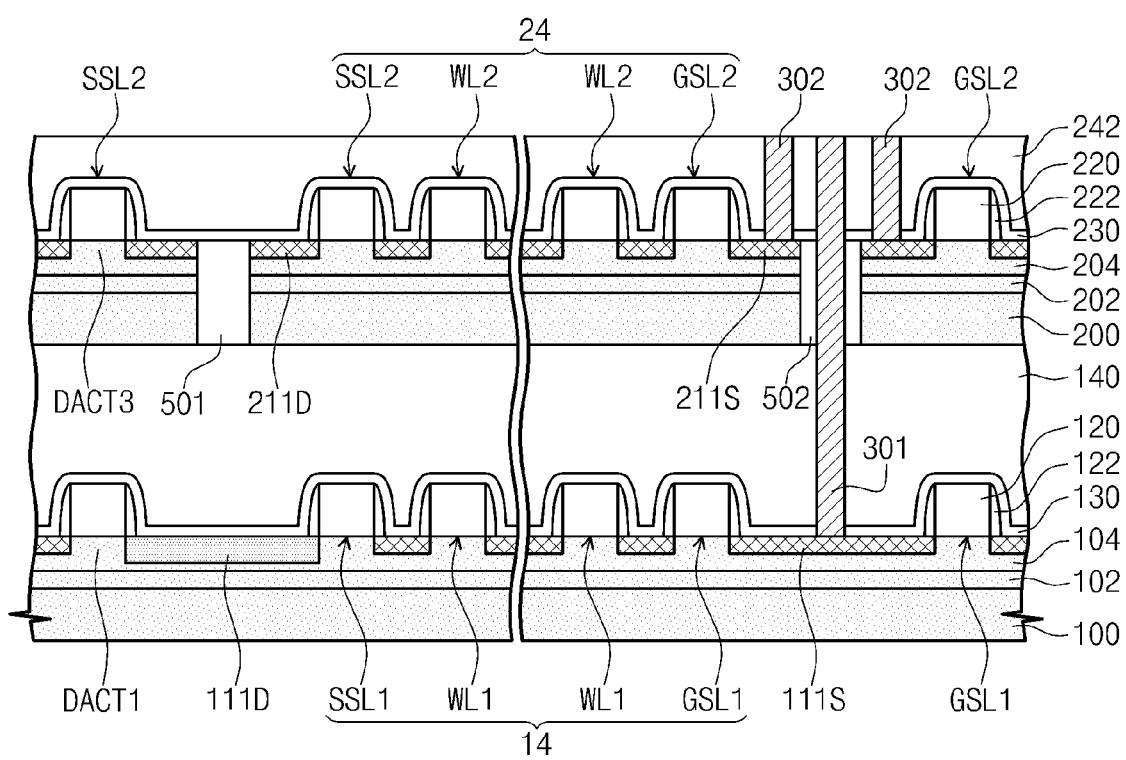

FIGS. 8A through 8C further illustrate a method of fabricating a flash memory device according to an embodiment of the invention. Specifically, FIG. 8A is a cross-sectional view taken along the line I-I' of FIG. 3A, FIG. 8B is a cross-sectional view taken along the line II-II' of FIG. 3A, and FIG. 8C is a cross-sectional view taken along the line III-III' of FIG. 3A.

Referring to FIGS. 8A through 8C, a top deep well 202 and a top well region 204 are formed on the top semiconductor layer 200 using a conventional ion implantation process. The conductivity type of the top deep well 202 is assumed to be N-type, and the conductivity of the deep well region 204 is assumed to be P-type. A device isolation process may be performed to define a top active region ACT2 and a top dummy active region DACT3. The top dummy active regions DACT3 and DACT4 comprise a first top dummy active region DACT3 and a second top dummy active region DACT4.

A top gate structure 220 is formed on the top semiconductor layer 200. The top gate structure 220 may be a floating gate-type structure or a charge trap-type structure. A top gate spacer 222 is then formed on a side surface of the gate structure 220. The top gate spacer 222 may be formed by forming a top gate spacer layer (not shown) on the gate structure 220 and anisotropically etching the top gate spacer layer.

A top etch-stop layer 230 is formed on the top gate structure 200. A top drain region 210D and a top source region 210S are formed at the top active region ACT2 using an ion implantation process. A top dummy drain region 213D of the second top dummy active region DACT2 is then exposed using a photoresist pattern. The exposed dummy drain region 213D may be selectively doped with P-type impurities by means of an ion implantation process. A first top interlayer dielectric 242 is deposited on the top gate structure 220. A top surface of the first top interlayer dielectric 242 may be planarized, as needed.

A top source contact hole is formed by patterning the first top interlayer dielectric 242 to expose a top source region 210S of the top active region ACT2. A bottom source contact hole is formed by successively patterning the first top interlayer dielectric 242, the source penetrating portion 502, the bottom interlayer dielectric 140 to expose the bottom source region 110S. A conductive layer is deposited to fill the top source contact hole and the bottom source contact hole. The top semiconductor layer 200 may be planarized to form a top common source line contact plug 302 and a bottom common source line contact plug 301. Formation of the top common source line contact plug 302 may also form top dummy source regions 211S and 213S of the top dummy active regions DACT3 and DACT4. Formation of the bottom common source line contact plug 301 may also form bottom dummy source regions 111S and 113S of the bottom dummy active regions DACT1 and DACT2. The top common source line contact plug 302 is electrically connected to the top source region 210S and/or the top dummy source regions 211S and 213S. The bottom common source line contact plug 301 is electrically connected to the bottom source region 110S.

Returning to FIGS. 3A through 3D, a second top interlayer dielectric 244 is formed on the first top interlayer dielectric 242. A top drain contact hole (not shown) may be formed by successively patterning the second top interlayer dielectric 244 and the first top interlayer dielectric 242 to expose the top drain region 210D. A bottom drain contact hole (not shown) is formed by successively patterning the second top interlayer dielectric 244, the first top interlayer dielectric 242, the drain penetrating portion 501, and the bottom interlayer dielectric 140 to expose the bottom drain region 110D. The bottom drain contact hole and the top drain contact hole may be formed at the same time.

A top well bias line contact hole (not shown) is formed by successively patterning the second top interlayer dielectric 244 and the first top interlayer dielectric 242 to expose the top dummy drain region 213D. A bottom well bias line contact hole (not shown) is formed by successively patterning the second top interlayer dielectric 244, the first top interlayer dielectric 242, the drain penetrating portion 501, and the bottom interlayer dielectric 140 to expose the bottom dummy drain region 111D.

The bottom well bias line contact hole and the top well bias line contact hole may be formed at the same time. A conductive layer is deposited on the top semiconductor layer 200 to fill a well bias line contact hole and a bitline contact hole. The conductive layer may be planarized to form well bias line contact plugs 510 and 520 and bitline contact plugs 401 and 402. The well bias line contact plugs 510 and 520 may comprise a top well bias line contact plug 520 and a bottom well bias line contact plug 510, and the bitline contact plugs 401 and 402 comprise a top bitline contact plug 402 and a bottom bitline contact plug 401.

A conductive layer is deposited on the second top interlayer dielectric 244 and etched to form a bitline BL and well bias lines WBL1 and WLB2. The bitline BL is connected to the bitline contact plugs 401 and 402. The well bias lines WBL1 and WBL 2 is connected to the well bias line contact plugs 510 and 520, respectively. The well bias lines WBL1 and WBL2 comprise a bottom well bias line (WBL1) 32 connected to the bottom well bias line contact plug 510 and a top well bias line (WBL2) 34 connected to the top well bias line contact plug 520. The bitline BL and the well bias lines WBL1 and WBL2 may extend in a coplanar manner with respect to each other.

A method of fabricating a flash memory device according to another embodiment of the invention, shown in FIG. 6, will now be described below in some additional detail.

Figure 9A:
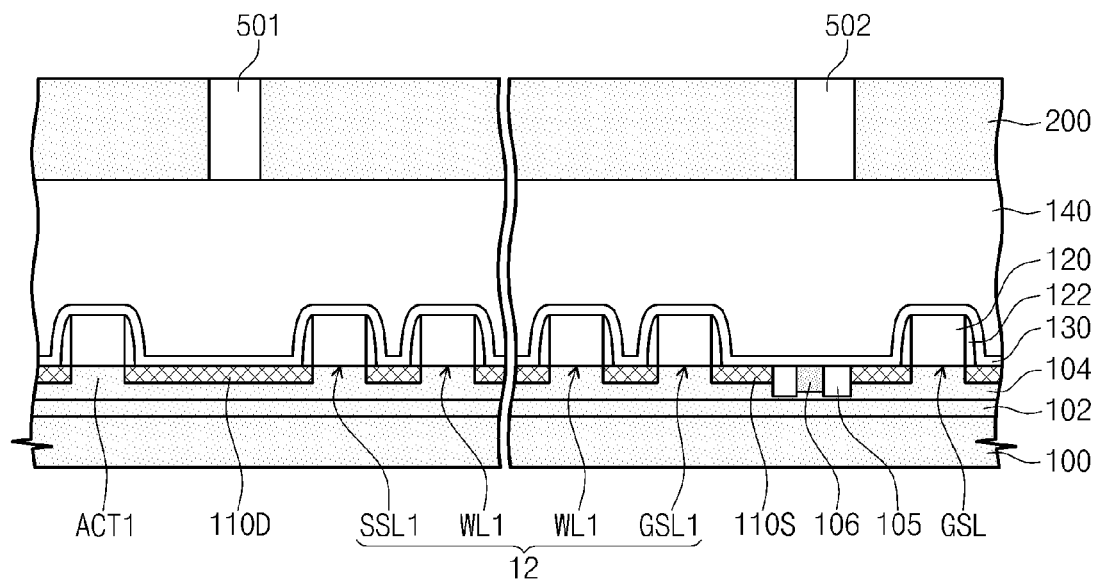
FIGS. 9A and 9B illustrate a method of fabricating a flash memory device according to another embodiment of the invention.
Figure 9B:
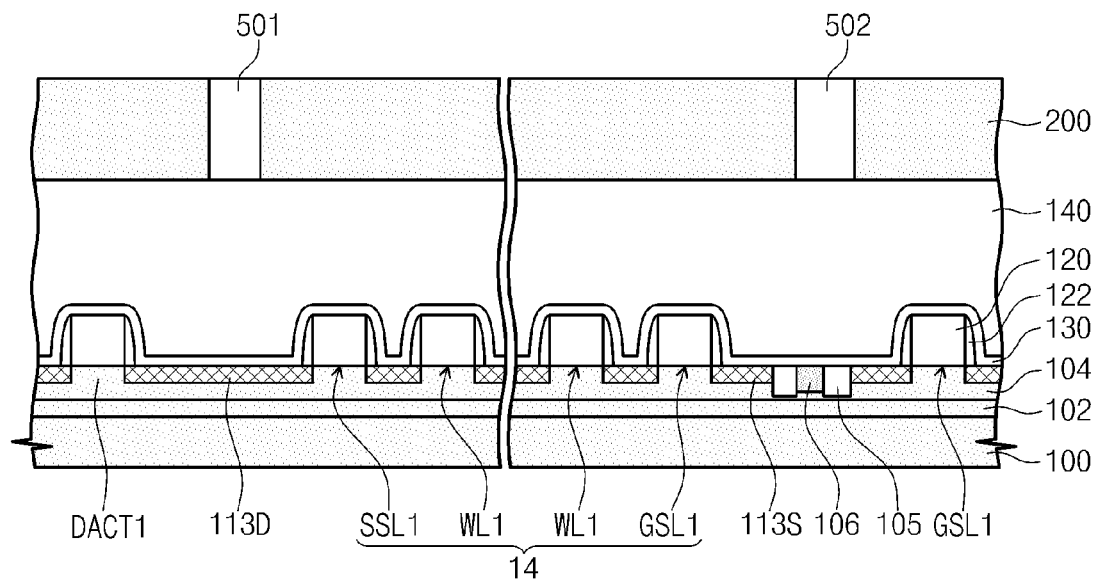

FIGS. 9A and 9B illustrate a method of fabricating a flash memory device according to another embodiment of the invention. Specifically, FIG. 9A is a cross-sectional view taken along the line I-I' of FIG. 6A and FIG. 9B is a cross-sectional view taken along the line II-II' of FIG. 6A.

Referring to FIGS. 9A and 9B, a bottom deep well 102 and a bottom well 104 are formed in a bottom semiconductor layer 100. The bottom deep well 102 and the bottom well 104 may be formed using an ion implantation process. A trench (not shown) may be formed by patterning the bottom semiconductor layer 100 to define a bottom active region ACT1 and a bottom dummy active region DACT1. The trench may be filled with a device isolation layer 105, which may be formed using a conventional shallow trench isolation (STI) process or a self-aligned STI process. An isolation well region 106 is formed at a predetermined region of the bottom semiconductor layer 100. The isolation well region 106 is divided by the bottom active region ACT1 and/or the dummy active region DACT1 and the device isolation layer 105.

A bottom gate structure 120 is now formed. A bottom gate spacer 122 is formed on a side surface of the bottom gate structure 120. A bottom etch-stop layer 130 is conformally formed on the entire surface of the bottom gate structure 120.

Following formation of the bottom gate structure 120, an N-type ion implantation process is performed to form a bottom source region 110S and a bottom drain region 110D at the bottom active region ACT1. By means of the ion implantation process, a bottom dummy source region 113S and a bottom drain region 113D are formed at the bottom dummy active region DACT1. The isolation well region 106 may be opened using a photoresist mask. The isolation well region 106 is then doped with the same conductivity type as the bottom well region 104. A bottom interlayer dielectric 140 is formed on the bottom gate structure 120. A top surface of the bottom interlayer dielectric 140 may be planarized, as needed.

A top semiconductor layer 200 is disposed on the bottom interlayer dielectric 140 using a conventional bonding technique. The top semiconductor layer 200 may be planarized. The top semiconductor layer 200 is then patterned to form a drain penetrating portion 501 and a source penetrating portion 502. The drain penetrating portion 501 and the source penetrating portion 502 may be planarized after being filled with (e.g.,) a silicon oxide layer.

Figure 10A:
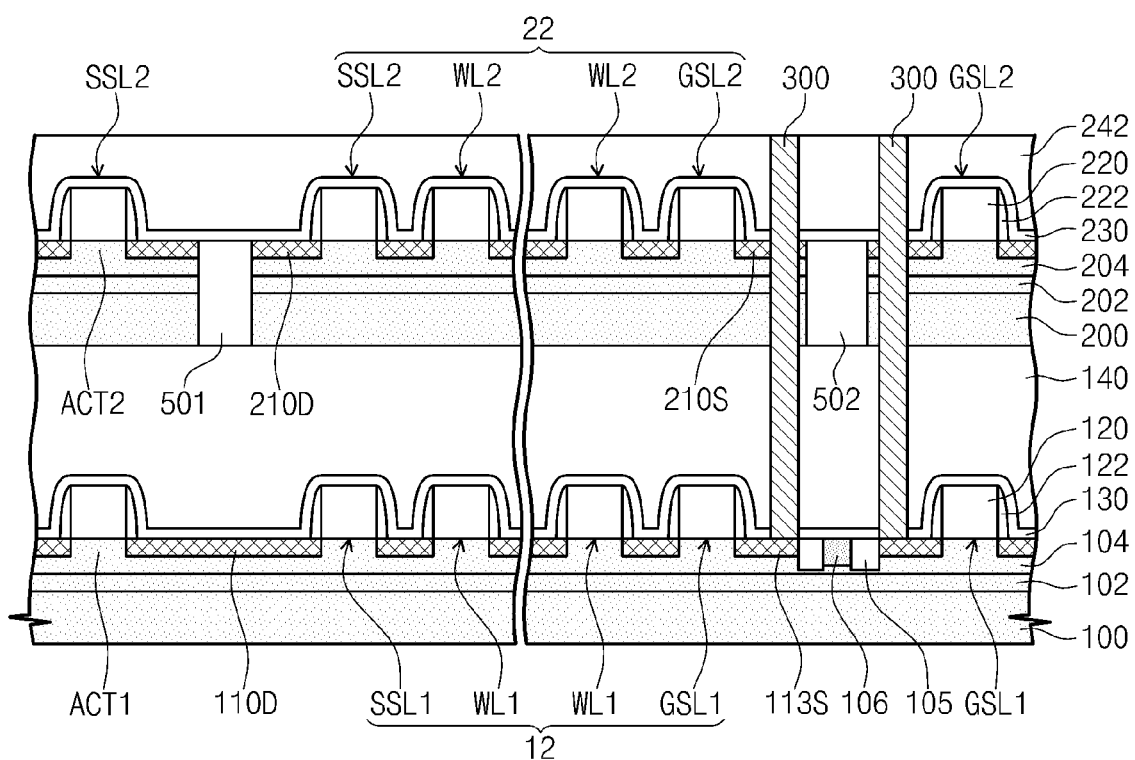
FIGS. 10A and 10B illustrate a method of fabricating a flash memory device according to yet another embodiment of the invention.
Figure 10B:
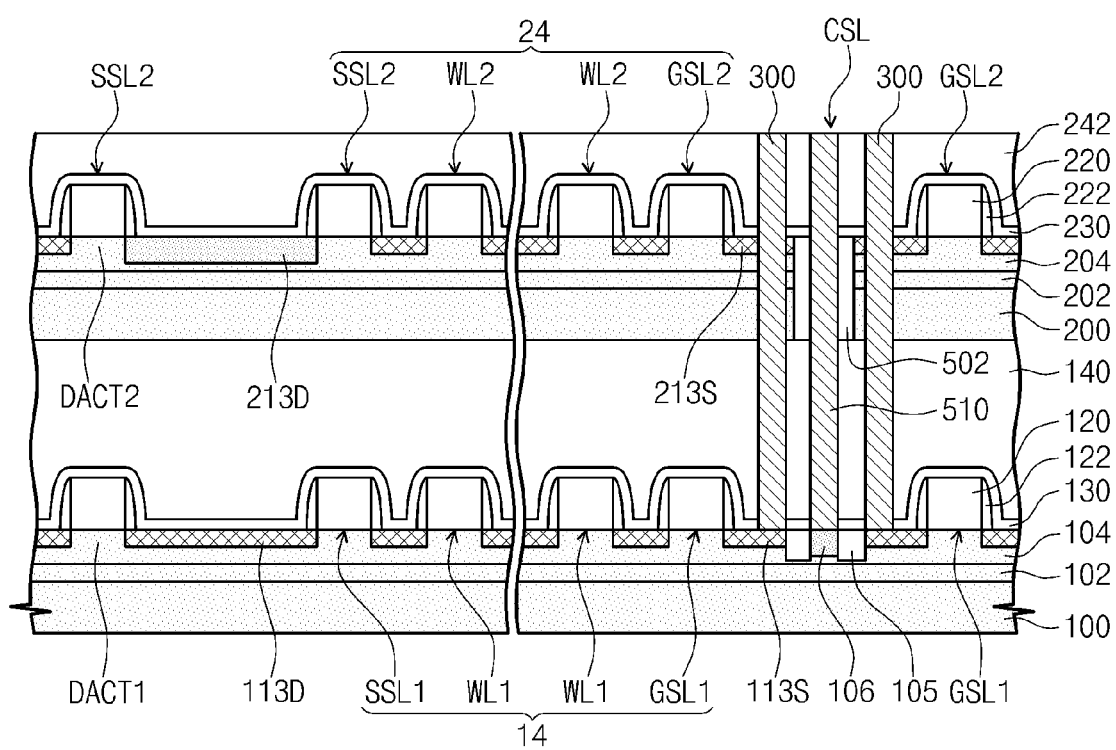

FIGS. 10A and 10B illustrate a method of fabricating a flash memory device according to yet another embodiment of the invention. Specifically, FIG. 10A is a cross-sectional view taken along the line I-I' of FIG. 6A and FIG. 10B is a cross-sectional view taken along the line II-II' of FIG. 6A.

Referring to FIGS. 10A and 10B, a top deep well 202 and a top well 204 are formed on a bottom semiconductor layer 200 using an ion implantation process. The top deep well 202 is assumed to be N-type and the top well region 204 is assumed to be P-type. A device isolation layer may be formed to define a top active region ACT2 and a top dummy active region DACT2. A top gate structure 220 is formed on the bottom semiconductor layer 200. The top gate structure 220 may be a floating gate-type structure or a charge trap-type structure. A top gate spacer 222 is then formed on a side surface of the top gate structure 220. A top etch-stop layer 230 is formed on the top gate structure 220. A top drain region 210D and a top source region 210S are formed in the top active region ACT2 using an ion implantation process. A top dummy drain region 213D of the top dummy active region DACT2 is exposed using a photoresist pattern. The exposed dummy drain region 213D is then doped with P-type impurities using an ion implantation process. A first top interlayer dielectric 242 is deposited on the top gate structure 220. A top surface of the first top interlayer dielectric 242 may then be planarized.

A source contact hole is formed by successively patterning the first top interlayer dielectric 242, the top semiconductor layer 200, and the bottom interlayer dielectric 140 to expose a bottom source region 110S of the bottom active region ACT1. A bottom well bias line contact hole is formed by successively patterning the first top interlayer dielectric 242, the source penetrating portion 501, and the bottom interlayer dielectric 140 to expose the isolation well 106. A conductive layer is deposited to fill the source contact hole and the bottom well bias contact hole. The top semiconductor layer 200 may then be planarized to form a common source line contact plug 300 and a bottom well bias line contact plug 510. The bottom well bias line contact plug 510 is electrically connected to the isolation well 106. A conductive layer is formed on the top semiconductor layer 200. The conductive layer may be patterned to form a common source line CSL and bottom well bias lines (WBL1) 32. The common source line CSL is connected to the common source line contact plug 300, and the bottom well bias line (WBL1) 32 may be connected to the bottom well bias line contact plug 510.

Returning to FIGS. 6A through 6D, a second top interlayer dielectric 244 is formed on the first interlayer dielectric 242. A top bitline contact hole is formed by successively patterning the second top interlayer dielectric 244 and the first top interlayer dielectric 242 to expose the top drain region 210D. A bottom bitline contact hole is formed by successively patterning the second top interlayer dielectric 244, the first top interlayer dielectric 242, the drain penetrating portion 501, and the top interlayer dielectric 140 to expose the bottom drain region 110D. The bottom drain contact hole and the top drain contact hole may be formed at the same time.

A top well bias line contact hole is formed by successively patterning the second top interlayer dielectric 244 and the first top interlayer dielectric 242 to expose the top dummy drain region 213D. The top and bottom bitline contact holes and the top well bias line contact hole may be formed at the same time. A conductive layer is deposited on the top semiconductor layer 200 to fill the well bias line contact hole and the top and bottom bitline contact hole. The conductive layer may then be planarized to form a top well bias line contact plug 520 and bitline contact plugs 401 and 402. The bitline contact plugs 401 and 402 comprise a top bitline contact plug 402 and a bottom bitline contact plug 401. The top bitline contact plug 402 is electrically connected to the top drain region 210D, and the bottom bitline contact plug 401 is electrically connected to the bottom drain region 110D. The top well bias line contact plug 520 is electrically connected to the top dummy drain region 213D.

A conductive layer is deposited on the second top interlayer dielectric 244 and patterned to form a bitline BL and a top well bias line (WBL2) 34. The bitline BL is connected to the bitline contact plugs 401 and 402. The bitline BL and the top well bias line (WBL2) 34 may be formed to extend in a coplanar manner in parallel with each other.

Any one of the foregoing device embodiments may be operated according to a method embodiment of the present invention. For example, one method of operating a flash memory device assumes that the device includes; a bottom memory cell array including a bottom semiconductor layer, a bottom well region formed at the bottom semiconductor layer, and a plurality of bottom memory cell units disposed on the bottom well region; a top memory cell array disposed over the bottom memory cell array and including a top semiconductor layer, a top well region formed at the top semiconductor layer, and a plurality of top memory cell units disposed on the top well region; and a well bias line disposed over the top memory cell array and including a bottom well bias line and a top well bias line, wherein the bottom well bias line is electrically connected to the bottom well region, and the top well bias line is electrically connected to the top well region.

Given this structural assumption, one voltage may be applied to the bottom well bias line to program or erase the bottom memory cell array, while a second voltage may be applied to the top well bias line to independently program or erase the top memory cell array.

Although the present invention has been described in connection with the embodiment of the present invention illustrated in the accompanying drawings, it is not limited thereto. It will be apparent to those skilled in the art that various substitutions, modifications and changes may be made without departing from the scope of the invention.

What is claimed is:

1. A flash memory device comprising:
    a bottom memory cell array including a bottom semiconductor layer, a bottom well formed in the bottom semiconductor layer, and a plurality of bottom memory cell units disposed on the bottom well;
    a top memory cell array disposed over the bottom memory cell array and including a top semiconductor layer, a top well formed in the top semiconductor layer, and a plurality of top memory cell units disposed on the top well; and
    a well bias line disposed over the top memory cell array and including a bottom well bias line and a top well bias line, wherein the bottom well bias line is electrically connected to the bottom well, and the top well bias line is electrically connected to the top well.

2. The flash memory device as set forth in claim 1, wherein the bottom memory cell array further includes a bottom dummy memory cell unit, and the top memory cell array further includes a top dummy memory cell unit non-aligned with the bottom dummy memory cell unit; and
    the bottom well bias line is disposed in a region of the bottom semiconductor layer where the bottom dummy memory cell unit is disposed, and the top well bias line is disposed in a region of the top semiconductor layer where the top dummy memory cell unit is disposed.

3. The flash memory device as set forth in claim 2, wherein the top dummy memory cell unit and the bottom memory cell units respectively include a bottom string selection transistor, a bottom ground selection transistor, and a plurality of bottom cell transistors serially connected between the bottom string selection transistor and the bottom ground selection transistor;
    the top dummy memory cell unit and the top memory cell units include a top string selection transistor, a top ground selection transistor, and a plurality of top cell transistors serially connected between the top string selection transistor and the top ground selection transistor; and
    the bottom well bias line is connected to the bottom well through a bottom dummy drain region of the bottom string selection transistor of the bottom dummy memory cell unit, and the top well bias line is connected to the top well through a top dummy drain region of the top string selection transistor of the top dummy memory cell unit.

4. The flash memory device as set forth in claim 3, wherein a conductivity type for the top dummy drain region and the bottom dummy drain region is opposite that of a top drain region for the top memory cell units and a bottom drain region of the bottom memory cell units.

5. The flash memory device as set forth in claim 4, further comprising:
    a top well bias line contact plug disposed to electrically connect the top well bias line to the top dummy drain region; and
    a bottom well bias line contact plug disposed to electrically connect the bottom well bias line to the bottom dummy drain region.

6. The flash memory device as set forth in claim 5, wherein the top semiconductor layer further includes a drain penetrating portion formed on the bottom dummy drain region and a bottom drain region of the bottom semiconductor layer.

7. The flash memory device as set forth in claim 3, further comprising:
    a common source line disposed on the top memory cell array to electrically connect a source region of a ground selection transistor of the top memory cell units to a source region of a ground selection transistor of the bottom memory cell units.

8. The flash memory device as set forth in claim 7, wherein the top semiconductor layer further includes a source penetrating portion formed on the bottom dummy source region and a bottom source region of the bottom semiconductor layer, and the flash memory device as set forth in claim 7 further comprises:
    a common source line contact plug disposed to electrically connect a source region of a ground selection transistor of the top memory cell units to a source region of a ground selection transistor of the bottom memory cell units, wherein the common source line contact plug comprises:
        a top common source line contact plug disposed at a top source region of the ground selection transistor of the top memory cell units; and
        a bottom common source line contact plug provided on a bottom source region of the ground selection transistor of the bottom memory cell units and disposed to penetrate the source penetrating portion.

9. The flash memory device as set forth in claim 8, wherein the bottom common source line contact plug comprises:
    a first bottom common source line contact plug being in direct contact with the bottom common source region; and
    a second bottom common source line contact plug disposed in the source penetrating portion.

10. The flash memory device as set forth in claim 1, further comprising:
    a bitline disposed on the top memory cell array, the bitline corresponding to vertically aligned bottom memory cell units and top memory cell units.

11. The flash memory device as set forth in claim 10, wherein the top semiconductor layer further includes a drain penetrating portion formed on the bottom dummy drain region and a bottom drain region of the bottom semiconductor layer and the flash memory device as set forth in claim 10 further comprises:
    a top bitline contact plug disposed to electrically connect the bitline to the top drain region; and
    a bottom bitline contact plug provided to penetrate the bitline and the drain penetrating portion and electrically connected to the bottom drain region.

12. The flash memory device as set forth in claim 11, wherein the bottom bitline contact plug comprises:
    a first bitline contact plug being in direct contact with the bottom drain region; and
    a second bitline contact plug disposed in the drain penetrating portion.

13. The flash memory device as set forth in claim 10, wherein the bitline and the well bias line are disposed in a coplanar manner in parallel with each other.

14. The flash memory device as set forth in claim 1, wherein the bottom memory cell array further includes a bottom dummy memory cell unit, and the top memory cell array further includes a top dummy memory cell unit,
the bottom memory cell unit being vertically aligned with the top dummy memory cell unit.

15. The flash memory device as set forth in claim 14, wherein the bottom dummy memory cell unit and the bottom memory cell units include a bottom string selection transistor, a bottom ground selection transistor, and a plurality of bottom cell transistors serially coupled between the bottom string selection transistor and the bottom ground selection transistor;
the top dummy memory cell unit and the top memory cell units include a top string selection transistor, a top ground selection transistor, and a plurality of top cell transistors serially coupled between the top string selection transistor and the top ground selection transistor;
the top well bias line is connected to the top well region through a top dummy drain region of the top string selection transistor of the top dummy memory cell unit; and
the bottom well bias line is disposed adjacent to a bottom dummy source region of the bottom string selection transistor of the bottom dummy memory cell unit and is electrically connected to the bottom well region through an isolation well region electrically isolated from the bottom dummy source region.

16. The flash memory device as set forth in claim 15, further comprising:
a top well bias line contact plug disposed to electrically connect the top well bias line to the top dummy drain region; and
a bottom well bias line contact plug disposed to electrically connect the bottom well bias line to the isolation well region.

17. The flash memory device as set forth in claim 16, wherein the top semiconductor layer further includes a source penetrating portion formed on the isolation well region of the bottom semiconductor layer; and
the bottom well bias line contact plug is in contact with the isolation well region through the source penetrating portion.

18. The flash memory device as set forth in claim 15, further comprising:
a common source line disposed to electrically connect a bottom source region of the bottom ground selection transistor of the bottom memory cell units to a top source region of the top ground selection transistor of the top memory cell units,
wherein the bottom well bias line is disposed between the adjacent common source lines.

19. The flash memory device as set forth in claim 18, further comprising:
a common source line contact plug electrically connected to the common source line, the common source line contact plug being disposed on the bottom source region of the bottom semiconductor layer through the top semiconductor layer.

20. The flash memory device as set forth in claim 18, wherein the common source line and the bottom well bias line are disposed in a coplanar manner.

* * * * *